United States Patent
Lu et al.

(10) Patent No.: US 11,463,102 B2
(45) Date of Patent: Oct. 4, 2022

(54) DATA COMPRESSION METHOD, DATA DECOMPRESSION METHOD, AND RELATED APPARATUS, ELECTRONIC DEVICE, AND SYSTEM

(71) Applicant: HUAWEI TECHNOLOGIES CO., LTD., Guangdong (CN)

(72) Inventors: Chao Lu, Shenzhen (CN); Baoqing Liu, Hangzhou (CN); Leijun He, Hangzhou (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 31 days.

(21) Appl. No.: 17/162,153

(22) Filed: Jan. 29, 2021

(65) Prior Publication Data
US 2021/0152183 A1 May 20, 2021

Related U.S. Application Data

(63) Continuation of application No. PCT/CN2019/098758, filed on Jul. 31, 2019.

(30) Foreign Application Priority Data
Jul. 31, 2018 (CN) .......................... 201810859928.3

(51) Int. Cl.
*H03M 7/00* (2006.01)
*H03M 7/30* (2006.01)

(52) U.S. Cl.
CPC ....... *H03M 7/3059* (2013.01); *H03M 7/6005* (2013.01); *H03M 7/6011* (2013.01); *H03M 7/6023* (2013.01)

(58) Field of Classification Search
CPC ............. H03M 7/3059; H03M 7/6005; H03M 7/6011; H03M 7/6023; H03M 7/40; H03M 7/30; H03M 7/55

(Continued)

(56) References Cited

U.S. PATENT DOCUMENTS 6,819,271 B2 * 11/2004 Geiger .................... H03M 7/40
                                                                     341/51
8,497,788 B1    7/2013 Miller et al.
(Continued)

FOREIGN PATENT DOCUMENTS

CN            1247669 A    3/2000
CN          103384884 A   11/2013

OTHER PUBLICATIONS

Yuan Xie et al: "Code compression for VLIW processors using variableto-fixed coding", 15th. International Symposium on System Synthesis. ISSS.Kyoto, Japan, Oct. 2-4, 2002, New York, NY : ACM, US, XP058240336, 6 pages.

(Continued)

*Primary Examiner* — Jean B Jeanglaude
(74) *Attorney, Agent, or Firm* — Womble Bond Dickinson (US) LLP

(57) ABSTRACT

In the data compression method, a raw data block in raw data is processed based on a compression algorithm to obtain a standard compressed data block that has a length of L2 and that corresponds to the raw data block, and the raw data is further compressed into one or more standard compressed data blocks that each have the length of L2 and that are to be decompressed in parallel by a decompression apparatus, where the decompression apparatus includes a plurality of decompression engines, and each decompression engine is capable of decompressing one standard compressed data block within one processing cycle. According to the data compression method, a standard compressed data block with a fixed length can be obtained through compression.

20 Claims, 14 Drawing Sheets

(58) Field of Classification Search
USPC ...................................................... 341/50, 51
See application file for complete search history.

(56) References Cited

U.S. PATENT DOCUMENTS

| | | | |
|---|---|---|---|
| 9,413,386 B1* | 8/2016 | Senior | H03M 7/6005 |
| 9,998,143 B2* | 6/2018 | Senior | H03M 7/3088 |
| 10,019,457 B1* | 7/2018 | Stefani | H03M 7/3059 |
| 2010/0079314 A1 | 4/2010 | Gonion | |
| 2011/0043387 A1 | 2/2011 | Abali et al. | |
| 2014/0167987 A1 | 6/2014 | Pell et al. | |
| 2015/0146785 A1* | 5/2015 | Bates | G06F 12/06 |
| | | | 375/240.16 |
| 2015/0227540 A1* | 8/2015 | Lin | G06F 16/221 |
| | | | 707/693 |
| 2016/0248441 A1* | 8/2016 | Senior | H03M 7/3086 |
| 2016/0344406 A1* | 11/2016 | Senior | H03M 7/30 |
| 2018/0314712 A1* | 11/2018 | Stefani | H03M 7/30 |

OTHER PUBLICATIONS

D. Lemire et al: Decoding billions of integers per second throughvectorization , Software-Practice and Experience, vol. 45, No. 1, May 15, 2014, XP055363887, 30 pages.

S. T. Klein et al: "Parallel Huffman Decoding with Applications to JPEGFiles", The Computer Journal, vol. 46, No. 5, 2003 , XP055012607, 11 pages.

* cited by examiner

S40: Determine L1 as an egress bit width of a single decompression engine and L2 as an ingress bit width of a single decompression engine S41: Independently compress each of S consecutive raw data blocks in raw data based on a compression algorithm to obtain S compressed data blocks, where the raw data blocks one-to-one correspond to the compressed data blocks, each of the S raw data blocks includes a plurality of pieces of consecutive data in the raw data, a length of the plurality of pieces of consecutive data is not greater than L1, a length d of each of the S compressed data blocks is not greater than L2, and S is a positive integer S42: Append additional data with a length of L2−d to each of the S compressed data blocks to generate S standard compressed data blocks that each have a length of L2, where one standard data block with the length of L2 can be completely decompressed by a single decompression engine in a decompression apparatus within one processing cycle, L1 and L2 are integers greater than 1, d is an integer greater than 0, and L1 is greater than L2

FIG. 4

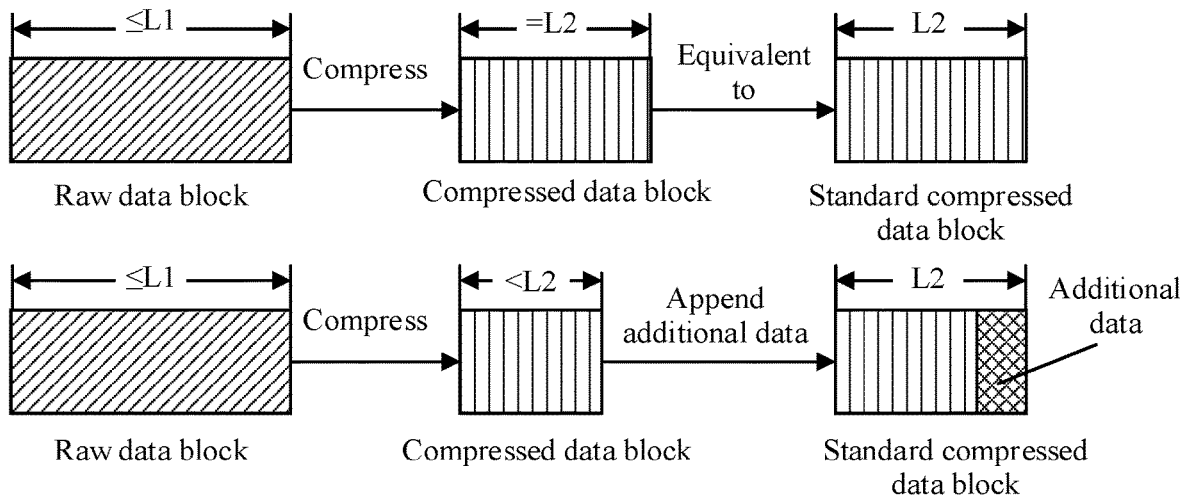

FIG. 5

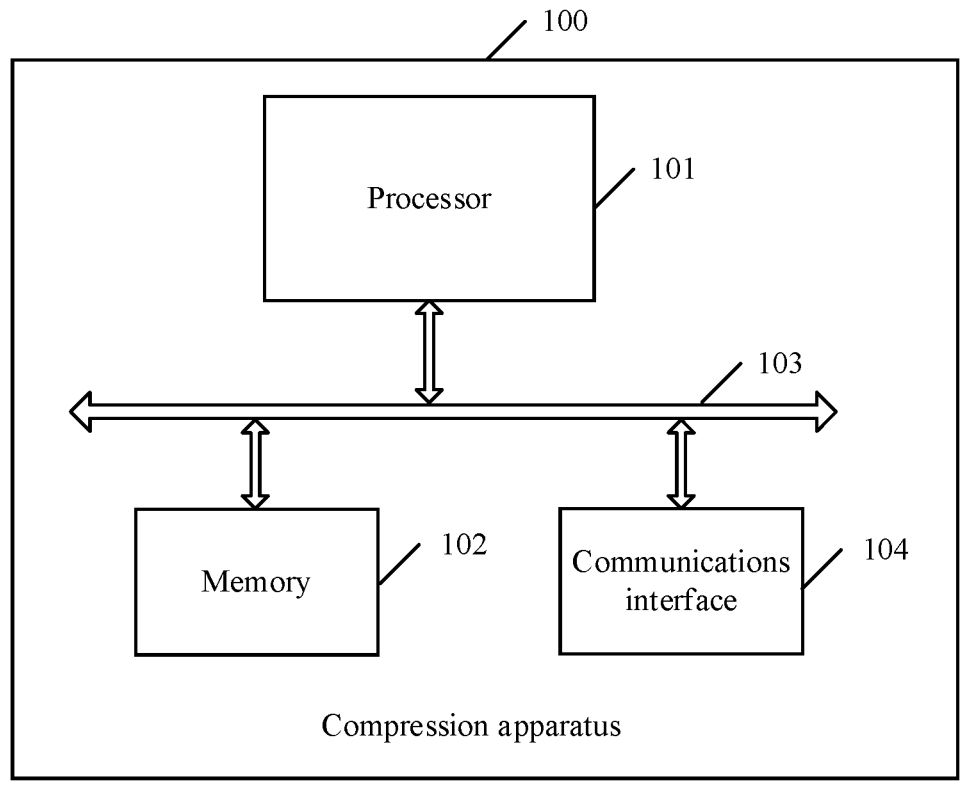

FIG. 10

S111: Obtain N standard compressed data blocks, where any one of the N standard compressed data blocks is a data block that has a length of L2 and that is generated after a raw data block is independently compressed, one standard compressed data block can be completely decompressed by a single decompression engine with one processing cycle S112: Decompress the N standard compressed data blocks respectively by using N decompression engines, to obtain N raw data blocks, where the standard compressed data blocks one-to-one correspond to the raw data blocks, and a length of any one of the N raw data blocks may be not greater than L1

S113: Splice the N raw data blocks to obtain raw data

FIG. 11

S141: A compression apparatus independently compresses each of S consecutive raw data blocks in raw data based on a compression algorithm to obtain S compressed data blocks that one-to-one correspond to the S raw data blocks, where each of the S raw data blocks includes a plurality of pieces of consecutive data in the raw data, a length of the plurality of pieces of consecutive data is not greater than L1, a length d of each of the S compressed data blocks is not greater than L2, S is a positive integer, a compressed data block with a length of L2 is a data block that can be completely processed by a single decompression engine in a decompression apparatus within one processing cycle, L1 and L2 are integers greater than 1, d is an integer greater than 0, and L1 is greater than L2

S142: Record the length of each of the S compressed data blocks

FIG. 14

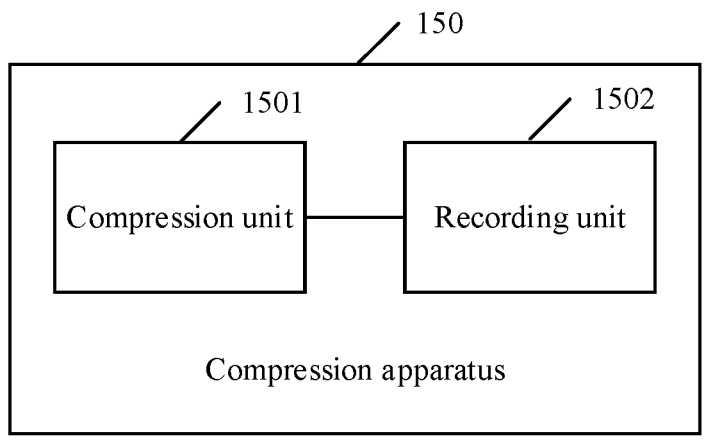

FIG. 15

DATA COMPRESSION METHOD, DATA DECOMPRESSION METHOD, AND RELATED APPARATUS, ELECTRONIC DEVICE, AND SYSTEM

CROSS-REFERENCE TO RELATED APPLICATIONS

This application is a continuation of International Application No. PCT/CN2019/098758, filed on Jul. 31, 2019, which claims priority to Chinese Patent Application No. 201810859928.3, filed on Jul. 31, 2018. The disclosures of the aforementioned applications are hereby incorporated by reference in their entireties.

TECHNICAL FIELD

The present application relates to the field of data compression technologies, and in particular, to a data compression method, a data decompression method, and a related apparatus, an electronic device, and a system.

BACKGROUND

For an operation with a relatively large data amount, for example, an operation in video processing, image processing, or machine learning, a hardware chip is usually used for acceleration. In a process of data processing performed by the hardware chip, a large amount of data usually needs to be imported from an external memory in real time. For example, hardware acceleration in the machine learning is a technology that can accelerate computation by using the hardware chip to execute a machine learning algorithm. A large quantity of parameters are usually required for running the machine learning algorithm. These parameters cannot be completely stored in the hardware chip. Therefore, a large quantity of parameters need to be imported from the outside in real time, to run the machine learning algorithm. Importing a large quantity of parameters in real time occupies input/output (I/O) bandwidth of the chip. When the I/O bandwidth is insufficient, a computation capability of the hardware chip is idle, and a running speed of the machine learning algorithm is reduced.

External parameters are compressed offline to reduce a volume of the external parameters, and in the hardware chip, a decompression engine is used to perform online decompression in real time to restore the external parameters. In this way, more external parameters can be transmitted when same I/O bandwidth is available. However, a decompression rate of the decompression engine is limited. This also limits the running speed of the machine learning algorithm.

Currently, a common method for improving a decompression rate of the hardware chip is multi-engine parallel decompression. FIG. 1 is a schematic diagram of a principle of decompression by a plurality of decompression engines in the prior art. When compressing a to-be-compressed file, an electronic device splits the to-be-compressed file into a plurality of equal-length raw data blocks, and separately compresses the plurality of raw data blocks to generate compressed data blocks that one-to-one correspond to the raw data blocks. During decompression, a plurality of compressed data blocks are obtained and are allocated to a plurality of decompression engines to restore a plurality of raw data blocks, and then the plurality of raw data blocks are spliced into an original file (namely, a to-be-compressed file).

It can be learned that, in the prior art, because compression rates of various raw data blocks are different, lengths of obtained compressed data blocks are different, and it takes different time to decompress each compressed data block by a corresponding decompression engine. A decompression apparatus can splice, only after the last compressed data block is decompressed, a raw data block restored by each decompression engine, to obtain required data. Decompression efficiency is low.

SUMMARY

To resolve a technical problem, embodiments of the present disclosuredisclosure provide a data compression method, a data decompression method, and a related apparatus, an electronic device, and a system, to generate a standard compressed data block by standardizing a process of compressing raw data. In this way, various decompression engines can synchronously decompress a plurality of standard compressed data blocks. This improves data decompression efficiency.

An embodiment of the present disclosuredisclosure provides a data compression method. The method may be applied to a first electronic device or a compression apparatus that is configured to compress raw data into one or more standard compressed data blocks that each have a length of L2 and that are to be decompressed in parallel by a decompression apparatus. The decompression apparatus includes a plurality of decompression engines, each decompression engine is capable of decompressing one standard compressed data block within one processing cycle, and L2 is an integer greater than 1. The method includes: compressing a raw data block for one or more times, and the compressing a raw data block includes: processing the raw data block based on a compression algorithm to obtain a standard compressed data block corresponding to the raw data block, where the raw data block is data included in the raw data.

According to an embodiment of the present disclosure, a standard compressed data block with a fixed length can be obtained through compression. In this way, various decompression engines can synchronously decompress a plurality of standard compressed data blocks. This improves data decompression efficiency.

In an embodiment of this disclosure, an implementation in which the first electronic device or the compression apparatus processes the raw data block based on the compression algorithm to obtain the standard compressed data block corresponding to the raw data block may include: independently compressing, by the compression apparatus, the raw data block based on the compression algorithm to obtain a compressed data block corresponding to the raw data block, where a length d of the compressed data block is not greater than L2; and further appending additional data with a length of L2-$d$ to the compressed data block, to generate the standard compressed data block with the length of L2, where d is an integer greater than 0.

In an embodiment of this disclosure, a processor of the compression apparatus or the first electronic device independently compresses each of S consecutive raw data blocks in the raw data based on the compression algorithm to obtain S compressed data blocks that one-to-one correspond to the S raw data blocks, where each of the S raw data blocks includes a plurality of pieces of consecutive data in the raw data, a length of the plurality of pieces of consecutive data is not greater than L1, a length d of each of the S compressed data blocks is not greater than L2, and S is a positive integer;

and further appends additional data with a length of L2-$d$ to each of the S compressed data blocks, to generate S standard compressed data blocks that each have the length of L2, where the standard data block with the length of L2 is a data block that can be completely processed by a single decompression engine in the decompression apparatus within one processing cycle, L1 and L2 are integers greater than 1, d is an integer greater than 0, and L1 is greater than L2. It may be understood that the data compression method may be performed by the first electronic device or the compression apparatus. The following provides description by using an example in which the data compression method is performed by the compression apparatus.

According to an embodiment, when the raw data is compressed, the length of each of the generated S standard compressed data blocks is a fixed value, namely, L2, and a length of a raw data block corresponding to the generated standard compressed data block is not greater than L1. In this way, the length of the compressed data block obtained by compressing the raw data is standardized, and each standard compressed data block is obtained through independent compression, and further may be independently decompressed. Therefore, various decompression engines can synchronously decompress the plurality of standard compressed data blocks, and each decompression engine can completely process data with a specific length within one processing cycle and does not need to wait for an output of a decompression engine that performs decompression at a slowest speed. This avoids a "short plank" in the Cannikin Law, and improves data decompression efficiency. In addition, compared with a variable-length compressed data block obtained through compression, the standard compressed data block with the fixed length of L2 is set in this disclosure. In this way, a compressor does not need to record a length of each compressed data block, and a decompressor does not need to record a length of obtained data either. This simplifies a design of the decompressor.

Further, in the prior art, a quantity of raw data blocks into which raw data is divided is equal to a quantity of decompression engines, that is, the quantity of decompression engines limits a granularity level at which the raw data can be divided. As a result, a plurality of compressed data blocks obtained by compressing the raw data are relatively long. When data at a random address is accessed, a compressed data block in which the data at the random address is located needs to be decompressed. In a decompression process, because data in the compressed data block is associated, the compressed data block can be decompressed by only one decompression engine. This cannot implement multiple-speed decompression for compressed data. According to the technical solution in the foregoing method, the granularity level at which the raw data can be divided is irrelevant to the quantity of decompression engines, the raw data may be compressed into a large quantity of relatively small standard compressed data blocks, and the standard compressed data blocks are not associated. When the data at the random address is accessed, a plurality of consecutive standard compressed data blocks in which the data at the random address is located are input into a plurality of decompression engines for decompression. This can implement multiple-speed decompression for compressed data at the random address.

In an embodiment, a first raw data block is any one of the S raw data blocks. When a length of the first raw data block is equal to L1, additional data in a standard data block obtained by compressing the first raw data block is a valid codeword, or additional data includes an invalid flag and invalid data. When the length of the first raw data block is less than L1, the additional data includes an invalid flag and invalid data. The invalid flag is used to indicate that the additional data in which the invalid flag is located needs to be discarded. The invalid data is located behind the invalid flag, and may include data including 0 or more bits. The invalid data or the invalid flag is set in the foregoing manners. This can enable the decompression engine to stop decompression. In this way, correct data can be obtained, and decompression operations can be reduced. This reduces decompression power consumption.

Optionally, when one processing cycle includes a plurality of clock cycles, additional data in a standard compressed data block obtained by compressing the first raw data block includes an invalid flag and invalid data. The invalid flag is used to indicate that the additional data in which the invalid flag is located needs to be discarded. The invalid data is located behind the invalid flag, and may include data including 0 or more bits.

In an embodiment, an implementation in which the compression apparatus independently compresses the raw data block based on the compression algorithm to obtain the compressed data block corresponding to the raw data block may include the following blocks: S1: obtaining a to-be-compressed data group from the raw data, where the data group includes data including one or more bits; S2: determining whether the to-be-compressed data group needs to be compressed; and if the to-be-compressed data group needs to be compressed, performing S3, or if the to-be-compressed data group does not need to be compressed, performing S4, S3: compressing the to-be-compressed data block group, and performing S1 after the compression is completed; and S4: using data currently obtained through compression as the compressed data block. An implementation of the determining whether the to-be-compressed data group needs to be compressed may include: if a sum of a total length x of one or more data groups that have been compressed and a length $\Delta x$ of the to-be-compressed data group is not greater than L1, and a length of a compressed data block generated after the to-be-compressed data group is compressed is not greater than L2, determining that compression needs to be performed; if a sum of x and $\Delta x$ is not greater than L1, and a length of a compressed data block generated after the to-be-compressed data group is compressed is greater than L2, determining that no compression needs to be performed; or if a sum of x and $\Delta x$ is greater than L1, determining that no compression needs to be performed.

According to an embodiment, a data block can be compressed. This has advantages of simple implementation and high efficiency.

In an embodiment, another implementation in which the compression apparatus independently compresses the raw data block based on the compression algorithm to obtain the compressed data block corresponding to the raw data block may be: compressing, by the compression apparatus, a data block with a length of L1 in the raw data by using a data group as a step, to obtain a temporary compressed data block; and when a length of the temporary compressed data block is greater than L2, using, as the raw data block, a data block obtained after i data groups at the tail of the data block with the length of L1 are removed, and using, as the compressed data block, data obtained by compressing the raw data block, where the length of the compressed data block is not greater than L2, i is a positive integer, and i<L1; or when a length of the temporary compressed data block is not greater than L2, using the data block with the length of L1 as the raw data block, and using the temporary compressed data block as the compressed data block. According to the foregoing method, another specific implementation is provided, and has advantages of simple implementation and high compression efficiency.

Optionally, i is a minimum positive integer that makes the length of the compressed data block not greater than L2. A smaller value of i indicates more data to be compressed. This can improve compression efficiency.

In an embodiment, L1 is an egress bit width of a single decompression engine; and L2 is an ingress bit width of a single decompression engine. In this way, an existing hardware resource may be maximally used to increase an amount of data compressed each time. This can improve compression efficiency.

An embodiment of this disclosure further provides a compression apparatus, configured to compress raw data into one or more standard compressed data blocks that each have a length of L2 and that are to be decompressed in parallel by a decompression apparatus. The decompression apparatus includes a plurality of decompression engines, each decompression engine is capable of decompressing one standard compressed data block within one processing cycle, and L2 is an integer greater than 1. The compression apparatus includes: a processing module, configured to process a raw data block based on a compression algorithm to obtain a standard compressed data block corresponding to the raw data block, where the raw data block is data included in the raw data.

In an embodiment, the processing module includes:

a compression unit, configured to independently compress the raw data block based on the compression algorithm to obtain a compressed data block corresponding to the raw data block, where a length d of the compressed data block is not greater than L2; and a standardization unit, configured to append additional data with a length of L2-$d$ to the compressed data block to generate the standard compressed data block with the length of L2, where d is an integer greater than 0.

Optionally, the raw data block includes a plurality of pieces of consecutive data in the raw data, a length of the raw data block is not greater than L1, and L1 is an egress bit width of the decompression engine.

In an embodiment, the processing module may include:

a compression unit, configured to independently compress each of S consecutive raw data blocks in the raw data based on the compression algorithm to obtain S compressed data blocks that one-to-one correspond to the S raw data blocks, where each of the S raw data blocks includes a plurality of pieces of consecutive data in the raw data, a length of the plurality of pieces of consecutive data is not greater than L1, a length d of each of the S compressed data blocks is not greater than L2, and S is a positive integer; and a standardization unit, configured to append additional data with a length of L2-$d$ to each of the S compressed data blocks, to generate S standard compressed data blocks that each have the length of L2, where the standard data block with the length of L2 is a data block that can be completely decompressed by a single decompression engine in the decompression apparatus within one processing cycle, L1 and L2 are integers greater than 1, d is an integer greater than 0, and L1 is greater than L2.

In an embodiment, when the length of the raw data block is equal to L1, the additional data in the standard data block obtained by compressing the raw data block is a valid codeword; or the additional data includes an invalid flag and invalid data, where the invalid flag is used to indicate that the additional data needs to be discarded; or when the length of the raw data block is less than L1, the additional data includes an invalid flag and invalid data, where the invalid flag is used to indicate that the additional data needs to be discarded.

In another possible implementation, the compression unit is specifically configured to perform the following blocks:

S1: obtaining a to-be-compressed data group from the raw data, where the data group includes data including one or more bits;

S2: determining whether the to-be-compressed data group needs to be compressed; and if the to-be-compressed data group needs to be compressed, performing S3, or if the to-be-compressed data group does not need to be compressed, performing S4;

S3: compressing the to-be-compressed data block group, and performing S1 after the compression is completed; and S4: using data currently obtained through compression as the compressed data block.

The determining whether the to-be-compressed data group needs to be compressed includes: if a sum of a total length x of one or more data groups that have been compressed and a length $\Delta x$ of the to-be-compressed data group is not greater than L1, and a length of a compressed data block generated after the to-be-compressed data group is compressed is not greater than L2, determining that compression needs to be performed; if a sum of x and $\Delta x$ is not greater than L1, and a length of a compressed data block generated after the to-be-compressed data group is compressed is greater than L2, determining that no compression needs to be performed; or if a sum of x and $\Delta x$ is greater than L1, determining that no compression needs to be performed.

In an embodiment, the compression unit is specifically configured to perform the following blocks:

compressing a data block with a length of L1 in the raw data by using a data group as a step, to obtain a temporary compressed data block; and when a length of the temporary compressed data block is greater than L2, using, as the raw data block, a data block obtained after i data groups at the tail of the data block with the length of L1 are removed, and using, as the compressed data block, data obtained by compressing the raw data block, where the length of the compressed data block is not greater than L2, i is a positive integer, and i<L1; or when a length of the temporary compressed data block is not greater than L2, using the data block with the length of L1 as the raw data block, and using the temporary compressed data block as the compressed data block.

Optionally, i is a minimum positive integer that makes the compressed data block not greater than L2.

In an embodiment, L1 is an egress bit width of a single decompression engine; and/or L2 is an ingress bit width of a single decompression engine.

An embodiment of this disclosure further provides a compression apparatus, including a processor and a memory. The memory is configured to store data and a program instruction, and when the processor invokes the data and the program instruction that are stored in the memory, the compression apparatus is enabled to perform any one data compression method in the first aspect.

An embodiment of this disclosure further provides an electronic device having a compression function. The electronic device specifically is a first electronic device in the embodiments of this disclosure. The electronic device includes a compression apparatus and a processing apparatus, where the compression apparatus may be any one compression apparatus in the second aspect or the third aspect, and the processing apparatus is configured to send the raw data described above to the compression apparatus.

An embodiment of this disclosure further provides a computer storage medium. The computer storage medium is configured to store a computer software instruction, and when the computer software instruction is executed by a computer, the computer is enabled to perform any one data compression method in the first aspect.

An embodiment of this disclosure further provides a computer program. The computer program includes a computer software instruction, and when the computer software instruction is executed by a computer, the computer is enabled to perform any one data compression method in the first aspect.

An embodiment of this disclosure further provides a decompression apparatus, including a first memory, M decompression engines, and a second memory. The first memory is configured to store a plurality of standard compressed data blocks (for example, N standard compressed data blocks), where one standard compressed data block is a data block that has a length of L2 and that is generated after a raw data block is independently compressed, one standard compressed data block can be completely decompressed by a single decompression engine within one processing cycle, M is an integer greater than 1, M and N are positive integers, and M≥N. The M decompression engines are configured to decompress in parallel the standard compressed data blocks stored in the first memory, and one decompression engine is configured to decompress one standard compressed data block. For example, the M decompression engines include N decompression engines, and each of the N decompression engines is configured to: obtain one of the N standard compressed data blocks, and decompress the obtained standard compressed data block, to obtain N raw data blocks that one-to-one correspond to the N standard compressed data blocks.

The second memory is configured to store raw data blocks obtained by decompressing the standard compressed data blocks, for example, the N raw data blocks. The standard compressed data blocks one-to-one correspond to the raw data blocks.

Optionally, a length of the raw data block is not greater than L1, and L1 is an egress bit width of the decompression engine.

In an embodiment embodiment, the plurality of standard compressed data blocks are respectively decompressed in parallel by using the plurality of decompression engines. In this way, the decompression engines can decompress the plurality of standard compressed data blocks in parallel. This improves data decompression efficiency. In addition, compared with a variable-length compressed data block obtained through compression, the standard compressed data block with the fixed length of L2 is set in this disclosure. In this way, a compressor does not need to record a length of each compressed data block, and a decompressor does not need to record a length of obtained data either. This simplifies a design of the decompressor.

Further, in the prior art, a quantity of raw data blocks into which raw data is divided is equal to a quantity of decompression engines, that is, the quantity of decompression engines limits a granularity level at which the raw data can be divided. As a result, a plurality of compressed data blocks obtained by compressing the raw data are relatively long. When data at a random address is accessed, a compressed data block in which the data at the random address is located needs to be decompressed. In a decompression process, because data in the compressed data block is associated, the compressed data block can be decompressed by only one decompression engine. This cannot implement multiple-speed decompression for compressed data. According to the foregoing decompression apparatus, the granularity level at which the raw data can be divided is irrelevant to the quantity of decompression engines, and the raw data may be compressed into a large quantity of relatively small standard compressed data blocks. When the data at the random address is accessed, a plurality of consecutive standard compressed data blocks in which the data at the random address is located are input into a plurality of decompression engines for decompression. This can implement multiple-speed decompression for compressed data at the random address.

In an embodiment, the decompression apparatus further includes a splicing circuit. The splicing circuit is configured to splice the raw data blocks stored in the second memory, to obtain raw data. In this way, the raw data can be obtained through decompression and provided to a subsequent processing circuit for processing. This ensures that no data is lost.

In an embodiment, the decompression apparatus may further include a length counter, configured to record a length of data obtained through decompression. In this way, the splicing circuit can obtain data with a specific length based on a value in the length counter, and splice the data.

In an embodiment, each of the M decompression engines is further configured to: when a length of a raw data block obtained through decompression is equal to L1 or when an invalid flag is identified, stop the decompression operation. Decompression is stopped by identifying the invalid flag. This can reduce decompression operations and power consumption while ensuring that correct data is obtained.

In an embodiment, the decompression apparatus further includes a control circuit, configured to: when a length of a raw data block obtained by a first decompression engine through decompression is equal to L1, stop the decompression operation performed by the first decompression engine, where the first decompression engine is any one of the M decompression engines. Decompression is stopped by determining that data with a required length (L1) is obtained. This can reduce decompression operations and power consumption while ensuring that correct data is obtained.

In an embodiment, the second memory includes M storage subunits that one-to-one correspond to the M decompression engines, where a first storage subunit is configured to store a raw data block obtained, through decompression, by a decompression engine corresponding to the first storage subunit, and the first storage subunit is any one of the M storage subunits.

The decompression engines and the circuits (such as the control circuit and the splicing circuit) may be implemented based on a hardware circuit (such as an FPGA or an ASIC). This can increase a processing rate and a decompression speed.

An embodiment of this disclosure further provides an integrated circuit, including any one decompression apparatus in the seventh aspect.

Optionally, the integrated circuit may further include an operation apparatus coupled to the decompression apparatus, and the operation apparatus is configured to perform data processing based on raw data obtained by the decompression apparatus through decompression.

An embodiment of this disclosure further provides a data decompression method, applied to a decompression apparatus, where the decompression apparatus includes M decompression engines, and M is a positive integer. The method includes: obtaining, by the decompression apparatus, N standard compressed data blocks, where any one of the N standard compressed data blocks is a data block that has a length of L2 and that is generated after a raw data block is independently compressed, the standard compressed data block with the length of L2 is a data block that can be completely decompressed by a single decompression engine within one processing cycle, N is a positive integer, and M>N; decompressing the N standard compressed data blocks respectively by using N decompression engines, to obtain N raw data blocks that one-to-one correspond to the N standard compressed data blocks; and splicing the N raw data blocks to obtain raw data, where L1 and L2 are integers greater than 1, and L1 is greater than L2.

According to an embodiment, the N standard compressed data blocks that each have the length of L2 are synchronously decompressed respectively by using the N decompression engines. In this way, various decompression engines can synchronously decompress a plurality of standard compressed data blocks. This improves data decompression efficiency.

In addition, compared with a variable-length compressed data block obtained through compression, the standard compressed data block with the fixed length of L2 is set in this disclosure. In this way, a compressor does not need to record a length of each compressed data block, and a decompressor does not need to record a length of obtained data either. This simplifies a design of the decompressor.

Further, in the prior art, a quantity of raw data blocks into which raw data is divided is equal to a quantity of decompression engines, that is, the quantity of decompression engines limits a granularity level at which the raw data can be divided. As a result, a plurality of compressed data blocks obtained by compressing the raw data are relatively long. When data at a random address is accessed, a compressed data block in which the data at the random address is located needs to be decompressed. In a decompression process, because data in the compressed data block is associated, the compressed data block can be decompressed by only one decompression engine. This cannot implement multiple-speed decompression for compressed data. According to the technical solution in the foregoing method, the granularity level at which the raw data can be divided is irrelevant to the quantity of decompression engines, and the raw data may be compressed into a large quantity of relatively small standard compressed data blocks. When the data at the random address is accessed, a plurality of consecutive standard compressed data blocks in which the data at the random address is located are input into a plurality of decompression engines for decompression. This can implement multiple-speed decompression for compressed data at the random address.

In an embodiment, the N decompression engines include a decompression engine k, N compressed data blocks include a compressed data block k, the N raw data blocks include a raw data block k obtained by decompressing the compressed data block k, k is a positive integer, and k is not greater than N; and the decompressing the N standard compressed data blocks respectively by using N decompression engines, to obtain N raw data blocks that one-to-one correspond to the N standard compressed data blocks, specifically includes:

decompressing the compressed data block k by using the decompression engine k; and when a length of the raw data block k obtained by the decompression engine k through decompression is equal to L1, stopping the decompression operation performed by the decompression engine k on the compressed data block k, and outputting the raw data block k; or when the decompression engine k identifies an invalid flag, stopping the decompression operation performed by the decompression engine k on the compressed data block k, and outputting the raw data block k obtained through decompression.

An embodiment of this disclosure further provides an electronic device having a decompression function. The electronic device may specifically be a second electronic device in the embodiments of this disclosure, and may include a processor, and a memory and a decompression apparatus that are coupled to the processor, where the decompression apparatus is any one decompression apparatus in the seventh aspect, and the processor is configured to invoke data and an instruction that are stored in the memory, to implement a function of the second electronic device.

An embodiment of this disclosure further provides a compression and decompression system. The system includes a compression apparatus and a decompression apparatus, where the compression apparatus is any one compression apparatus in the second aspect or the third aspect, and the decompression apparatus is any one decompression apparatus in the seventh aspect.

An embodiment of this disclosure further provides a compression and decompression system, including a first electronic device and a second electronic device. The first electronic device is the electronic device having a compression function in the fourth aspect, and the second electronic device is the electronic device having a decompression function in the tenth aspect.

An embodiment of this disclosure further provides a data compression method, including:

independently compressing each of S consecutive raw data blocks in raw data based on a compression algorithm to obtain S compressed data blocks that one-to-one correspond to the S raw data blocks, where each of the S raw data blocks includes a plurality of pieces of consecutive data in the raw data, a length of the plurality of pieces of consecutive data is not greater than L1, a length d of each of the S compressed data blocks is not greater than L2, S is a positive integer, a compressed data block with a length of L2 is a data block that can be completely processed by a single decompression engine within one processing cycle, L1 and L2 are integers greater than 1, d is an integer greater than 0, and L1 is greater than L2; and recording the length of each of the S compressed data blocks.

The data compression method may be applied to a compression apparatus or a third electronic device having a compression function. Herein, description is provided by using an example in which the data compression method is applied to the compression apparatus.

A difference between this data compression method and the data compression method in the first aspect is that, in the data compression method in the first aspect, a standard compressed data block with a fixed length of L2 is finally obtained by appending additional data to a compressed data block obtained by compressing a raw data block. In this embodiment, a compressed data block obtained by compressing a raw data block is a finally obtained compressed data block, and has a variable length. A compression device needs to record a length of each compressed data block. In this way, a decompression device can distinguish between compressed data blocks with different lengths.

According to an embodiment, when the raw data is compressed, the length of each of the generated S compressed data blocks is less than L2. This is the same as that in the first aspect. In this way, each decompression engine can completely decompress a first compressed data block within one processing cycle, and further various decompression engines can perform decompression synchronously. This improves data decompression efficiency.

Further, in the prior art, a quantity of raw data blocks into which raw data is divided is equal to a quantity of decompression engines, that is, the quantity of decompression engines limits a granularity level at which the raw data can be divided. As a result, a plurality of compressed data blocks obtained by compressing the raw data are relatively long. When data at a random address is accessed, a compressed data block in which the data at the random address is located needs to be decompressed. In a decompression process, because data in the compressed data block is associated, the compressed data block can be decompressed by only one decompression engine. This cannot implement multiple-speed decompression for compressed data. According to the technical solution in the foregoing method, the granularity level at which the raw data can be divided is irrelevant to the quantity of decompression engines, and the raw data may be compressed into a large quantity of relatively small compressed data blocks. When the data at the random address is accessed, a plurality of consecutive standard compressed data blocks in which the data at the random address is located are input into a plurality of decompression engines for decompression. This can implement multiple-speed decompression for compressed data at the random address.

In an embodiment, a first raw data block is any one of the S raw data blocks, a first compressed data block is a compressed data block that is in the S compressed data blocks and that corresponds to the first raw data block, and an implementation in which the compression apparatus independently compresses the first raw data block based on the compression algorithm to obtain the first compressed data block may include:

S1: obtaining a to-be-compressed data group;

S2: determining whether the to-be-compressed data group needs to be compressed; and if the to-be-compressed data group needs to be compressed, performing S3, or if the to-be-compressed data group does not need to be compressed, performing S4;

S3: compressing the to-be-compressed data block group, and performing S1 after the compression is completed; and S4: using data currently obtained through compression as the first compressed data block.

The determining whether the to-be-compressed data group needs to be compressed includes: if a sum of a total length x of one or more data groups that have been compressed and a length $\Delta x$ of the to-be-compressed data group is not greater than L1, and a length of a compressed data block generated after the to-be-compressed data group is compressed is not greater than L2, determining that compression needs to be performed; if a sum of x and $\Delta x$ is not greater than L1, and a length of a compressed data block generated after the to-be-compressed data group is compressed is greater than L2, determining that no compression needs to be performed; or if a sum of x and $\Delta x$ is greater than L1, determining that no compression needs to be performed.

In an embodiment, a first raw data block is any one of the S raw data blocks, a first compressed data block is a compressed data block that is in the S compressed data blocks and that corresponds to the first raw data block, and another implementation in which the compression apparatus independently compresses the first raw data block in the raw data based on the compression algorithm to obtain the first compressed data block may be:

compressing, by the compression apparatus, a data block with a length of L1 in the raw data by using a data group as a step, to obtain a temporary compressed data block; and when a length of the temporary compressed data block is greater than L2, using, as the first raw data block, a data block obtained after i data groups at the tail of the data block with the length of L1 are removed, and using, as the first compressed data block, data obtained by compressing the first raw data block, where a length of the first compressed data block is not greater than L2, i is a positive integer, and i<L1; or when a length of the temporary compressed data block is not greater than L2, using the data block with the length of L1 as the first raw data block, and using the temporary compressed data block as the first compressed data block.

Optionally, i is a minimum positive integer that makes the first compressed data block not greater than L2.

In an embodiment, an implementation in which the third electronic device or the compression apparatus records the length of the first compressed data block may be:

recording, by the compression apparatus, the length d of the first compressed data block into a start field of the first compressed data block, where the start field is a field that starts from a start location of the first compressed data block and that has a length of a third length threshold; or writing the length d of the first compressed data block into a first file, where the first file includes lengths respectively corresponding to the S compressed data blocks obtained by a second compression device by sequentially compressing the raw data.

An embodiment of this disclosure further provides a compression apparatus, including:

a compression unit, configured to independently compress each of S consecutive raw data blocks in raw data based on a compression algorithm to obtain S compressed data blocks that one-to-one correspond to the S raw data blocks, where each of the S raw data blocks includes a plurality of pieces of consecutive data in the raw data, a length of the plurality of pieces of consecutive data is not greater than L1, a length d of each of the S compressed data blocks is not greater than L2, S is a positive integer, a compressed data block with a length of L2 is a data block that can be completely processed by a single decompression engine within one processing cycle, L1 and L2 are integers greater than 1, d is an integer greater than 0, and L1 is greater than L2; and a recording unit, configured to record the length of each of the S compressed data blocks.

In an embodiment, a first raw data block is any one of the S raw data blocks, a first compressed data block is a compressed data block that is in the S compressed data blocks and that corresponds to the first raw data block, and the compression unit is configured to perform the following blocks:

S1: obtaining a to-be-compressed data group;

S2: determining whether the to-be-compressed data group needs to be compressed; and if the to-be-compressed data group needs to be compressed, performing S3, or if the to-be-compressed data group does not need to be compressed, performing S4;

S3: compressing the to-be-compressed data block group, and performing S1 after the compression is completed; and S4: using data currently obtained through compression as the first compressed data block.

The determining whether the to-be-compressed data group needs to be compressed includes: if a sum of a total length x of one or more data groups that have been compressed and a length Δx of the to-be-compressed data group is not greater than L1, and a length of a compressed data block generated after the to-be-compressed data group is compressed is not greater than L2, determining that compression needs to be performed; if a sum of x and Δx is not greater than L1, and a length of a compressed data block generated after the to-be-compressed data group is compressed is greater than L2, determining that no compression needs to be performed; or if a sum of x and Δx is greater than L1, determining that no compression needs to be performed.

In an embodiment, a first raw data block is any one of the S raw data blocks, a first compressed data block is a compressed data block that is in the S compressed data blocks and that corresponds to the first raw data block, and the compression unit is specifically configured to:

compress a data block with a length of L1 in the raw data by using a data group as a step, to obtain a temporary compressed data block; and when a length of the temporary compressed data block is greater than L2, use, as the first raw data block, a data block obtained after i data groups at the tail of the data block with the length of L1 are removed, and use, as the first compressed data block, data obtained by compressing the first raw data block, where a length of the first compressed data block is not greater than L2, i is a positive integer, and i<L1; or when a length of the temporary compressed data block is not greater than L2, use the data block with the length of L1 as the first raw data block, and use the temporary compressed data block as the first compressed data block.

Optionally, i is a minimum positive integer that makes the first compressed data block not greater than L2.

In an embodiment, the recording unit is specifically configured to:

record the length d of the first compressed data block into a start field of the first compressed data block, where the start field is a field that starts from a start location of the first compressed data block and that has a length of a third length threshold; or write the length d of the first compressed data block into a first file, where the first file includes lengths respectively corresponding to a plurality of first compressed data blocks obtained by a second compression device by sequentially compressing the raw data.

An embodiment of this disclosure further provides a compression apparatus, including a processor and a memory. The memory is configured to store data and a program instruction, and the processor invokes the data and the program instruction that are stored in the memory, to perform the data compression data described in the thirteenth aspect.

An embodiment of this disclosure further provides an electronic device having a compression function. The electronic device may specifically be a third electronic device in the embodiments of this disclosure, and includes any one compression apparatus in the fourteenth aspect or the fifteenth aspect.

An embodiment of this disclosure further provides a computer storage medium. The computer storage medium is configured to store a computer software instruction, and when the computer software instruction is executed by a computer, the computer is enabled to perform any one data compression method in the thirteenth aspect.

An embodiment of this disclosure further provides a computer program. The computer program includes a computer software instruction, and when the computer software instruction is executed by a computer, the computer is enabled to perform any one data compression method in the thirteenth aspect.

An embodiment of this disclosure further provides a data decompression method, applied to a decompression apparatus. The decompression apparatus includes M decompression engines, and the method includes:

obtaining compressed data, where the compressed data includes N compressed data blocks and a length of each of the N compressed data blocks, N is a positive integer, any one of the N compressed data blocks is a data block that is obtained through independent compression and that has a length not greater than L2, N is a positive integer, and M≥N;

splitting the compressed data into the N compressed data blocks based on the length of each of the N compressed data blocks;

decompressing the N standard compressed data blocks respectively by using N decompression engines, to obtain N raw data blocks that one-to-one correspond to the N compressed data blocks; and splicing the N raw data blocks to obtain raw data.

An embodiment of this disclosure further provides a decompression apparatus, including a controller and M decompression engines, where the controller includes an obtaining unit, a splitting unit, a data distribution unit, and a splicing unit;

the obtaining unit is configured to obtain compressed data, where the compressed data includes N compressed data blocks and a length of each of the N compressed data blocks, N is a positive integer, any one of the N compressed data blocks is a data block that is obtained through independent compression and that has a length not greater than L2, N is a positive integer, and a compressed data block with a length of L2 is a data block that can be completely processed by a single decompression engine within one processing cycle;

the splitting unit is configured to split the compressed data into the N compressed data blocks based on the length of each of the N compressed data blocks;

the data distribution unit is configured to distribute the N compressed data blocks to N decompression engines in the M decompression engines, so that the N decompression engines respectively decompress the N compressed data blocks to obtain N raw data blocks that one-to-one correspond to the N compressed data blocks, where a length of any one of the N raw data blocks is not greater than L1, L1 and L2 are integers greater than 1, and L1 is greater than L2; and the splicing unit is configured to splice the N raw data blocks to obtain raw data.

An embodiment of this disclosure further provides a decompression apparatus. The decompression apparatus includes a controller, a first memory, M decompression engines, and a second memory, where the controller is configured to: obtain compressed data, where the compressed data includes N compressed data blocks and a length of each of the N compressed data blocks; and split the compressed data into the N compressed data blocks based on the length of each of the N compressed data blocks;

the first memory is configured to store the N compressed data blocks, where any one of the N compressed data blocks is a data block that is obtained through independent compression and that has a length not greater than L2, N is a positive integer, M≥N, and a compressed data block with a length of L2 is a data block that can be completely processed by a single decompression engine within one processing cycle;

each of N decompression engines is configured to: obtain one of the N compressed data blocks, and decompress the obtained compressed data block, to obtain N raw data blocks that one-to-one correspond to the N compressed data blocks, where a length of any one of the N raw data blocks is not greater than L1, L1 and L2 are integers greater than 1, and L1 is greater than L2; and the second memory is configured to store the N raw data blocks.

In an embodiment, the decompression apparatus further includes a splicing circuit.

The splicing circuit is configured to splice the N raw data blocks to obtain raw data.

An embodiment of this disclosure further provides an integrated circuit, including any one decompression apparatus in the twenty-first aspect. Optionally, the integrated circuit may further include an operation apparatus coupled to the decompression apparatus, and the operation apparatus is configured to perform data processing based on raw data obtained by the decompression apparatus through decompression.

An embodiment of this disclosure further provides an electronic device having a decompression function. The electronic device may specifically be a fourth electronic device in the embodiments of this disclosure, and includes any one decompression apparatus in the twentieth aspect or the twenty-first aspect, a processor coupled to the decompression apparatus, and a memory coupled to the processor.

An embodiment of this disclosure further provides a computer storage medium. The computer storage medium is configured to store a computer software instruction, and when the computer software instruction is executed by a computer, the computer is enabled to perform any one data decompression method in the nineteenth aspect.

An embodiment of this disclosure further provides a computer program. The computer program includes a computer software instruction, and when the computer software instruction is executed by a computer, the computer is enabled to perform any one data decompression method in the nineteenth aspect.

BRIEF DESCRIPTION OF DRAWINGS

To describe the technical solutions in the embodiments of the present disclosuredisclosure or in the background more clearly, the following briefly describes the accompanying drawings for describing the embodiments of the present disclosure or the background.

FIG. 4 is a schematic flowchart of a data compression method according to an embodiment of the present disclosure;

FIG. 5 is a schematic illustration of a data compression method according to an embodiment of the present disclosure;

FIG. 10 is a schematic structural diagram of another compression apparatus according to an embodiment of the present disclosure;

FIG. 11 is a schematic flowchart of a data decompression method according to an embodiment of the present disclosure;

FIG. 14 is a schematic flowchart of another data compression method according to an embodiment of the present disclosure;

FIG. 15 is a schematic structural diagram of still another compression apparatus according to an embodiment of the present disclosure;

DESCRIPTION OF EMBODIMENTS

Figure 1:
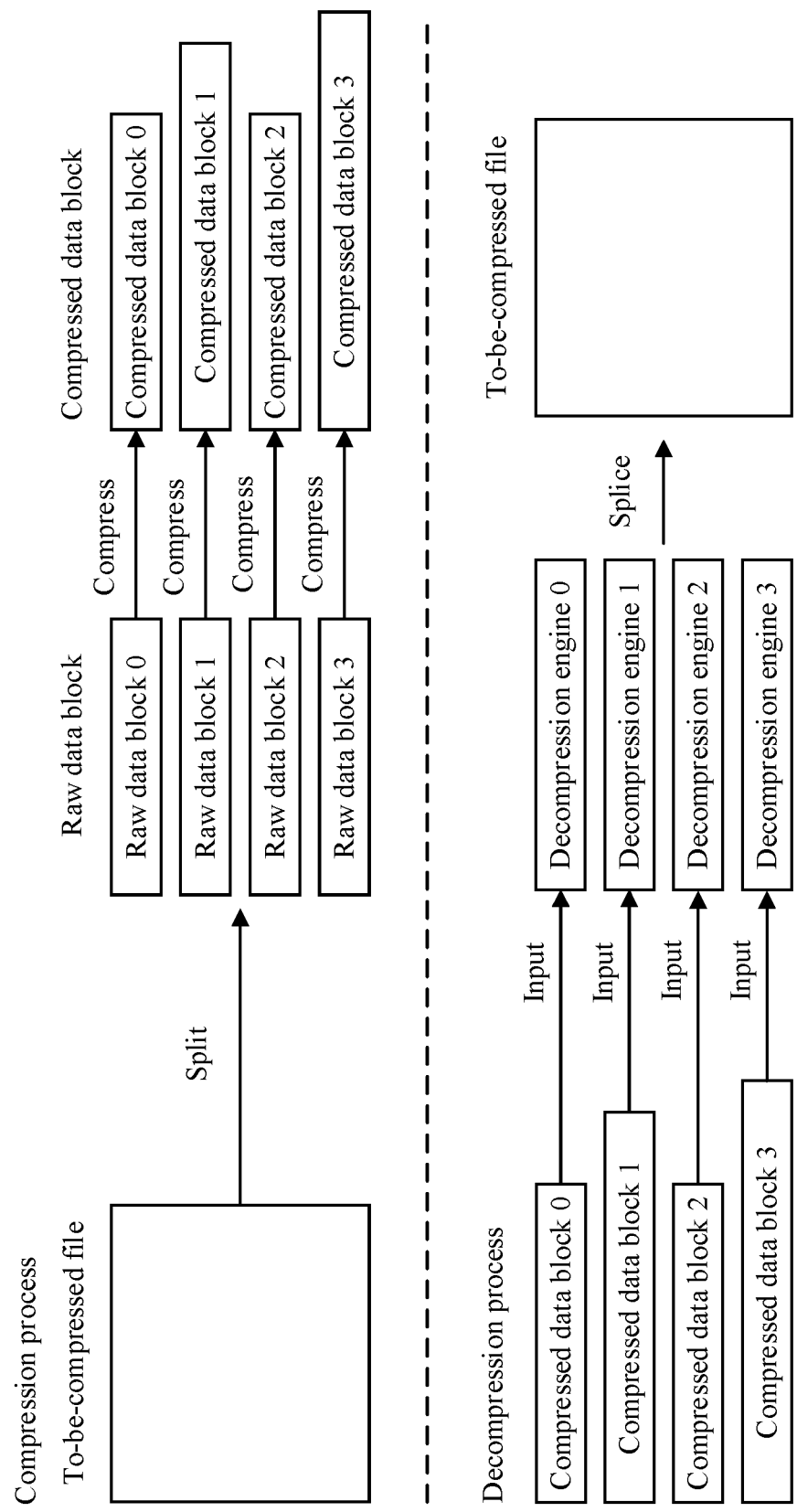
FIG. 1 is a schematic diagram of a principle of decompression by a plurality of decompression engines in the prior art.

The following briefly describes related concepts in the embodiments of the present disclosure.

(1) As a product, a system on chip (SoC) is an integrated circuit for special purposes, and includes a complete system and all content of embedded software. The complete system generally includes a central processing unit (CPU), a memory, a peripheral circuit, and the like. The SoC is also a technology that implements an entire process of determining system functions, dividing software/hardware, and completing design. In the embodiments of this disclosure, a decompression apparatus may alternatively be integrated into the SOC.

(2) A random access memory (RAM), also referred to as a "random memory", is an internal memory that directly exchanges data with a CPU, and is also referred to as a main memory (memory). The random access memory may support read and write operations at any time at a fast speed, and is usually used as a temporary data storage medium of an operating system or another running program.

(3) A double data rate synchronous dynamic random access memory (DDR SDRAM), also referred to as a DDR, is a series of memory interface protocols and an umbrella term of memories using the interface protocols, including DDR1, DDR2, DDR3, DDR4, and the like. The DDR memory can transmit data twice within one clock cycle, that is, transmit data once in each of a rising period and a falling period of a clock. Therefore, the DDR memory can achieve a higher data transmission rate at a bus frequency that is the same as that of an SDRAM.

(4) An AXI (Advanced eXtensible Interface) is a bus protocol. The protocol is a most important part of the AMBA (Advanced Microcontroller Bus Architecture) 3.0 protocol, and is an on-chip bus with high performance, high bandwidth, and low latency. The AXI bus sends an address, read data, write data, and a handshake signal through different channels. An access order may be disordered, and each access is represented by a BUSID. A primary device may initiate a plurality of read and write operations when no returned data is received. Read data may be disordered, and non-aligned data access is supported.

(5) A compression algorithm is a data compression algorithm. The compression algorithm is also referred to as signal encoding in the electronics and communications field, and includes two blocks: compression and restoration (or encoding and decoding). The compression algorithm in this disclosure is characterized by that an electronic device needs to sequentially scan and encode to-be-compressed characters. Therefore, the electronic device can monitor a length of compressed data while performing compression.

Optionally, the compression algorithm may be a general compression algorithm such as entropy encoding, run length coding (RLC), dictionary encoding, or a combination or variant thereof. This is not limited in the embodiments of this disclosure. The entropy encoding may include but is not limited to Huffman coding, arithmetic coding, and the like. The dictionary encoding includes but is not limited to an LZ (Lempel-Ziv) encoding series, and the LZ encoding series includes encoding such as deflate, LZ77, LZ78, LZW, and LZO. This is not limited in the embodiments of this disclosure.

(6) Huffman coding, also referred to as Huffman coding, is an encoding manner. The Huffman coding is a type of variable-length coding (VLC). In the Huffman coding, codewords with a shortest average length and different codeword headers are constructed based on a character occurrence probability. A codeword (namely, a code of each symbol) obtained through the Huffman coding is a hetero-prefix codeword, that is, any codeword is not a front part of another codeword. In this way, various codewords can be transmitted together and no isolation symbol needs to be added between the codewords. The codewords can still be separated at a received and are not confused, provided that no error occurs during the transmission.

(7) Run length coding (RLC), also referred to as "run length coding" or "run coding", is a type of statistical encoding. The encoding belongs to lossless compression encoding and is an important encoding method for raster data compression. A basic principle of run length coding is as follows: A symbol value or a string length is used to replace consecutive symbols with a same value (the consecutive symbols form a continuous "run"), to make a symbol length less than a length of raw data. When a code of data in each row or column changes, the code and a quantity of duplicate codes are recorded at a time, to implement data compression.

(8) Data group: A compression algorithm is used to compress a character string by data group. A data group usually includes one character or a plurality of consecutive characters. This is related to an encoding format of raw data. In this disclosure, a character is a meaningful minimum unit in the encoding format of the raw data, for example, includes one byte (8 bits) for text in an English format and four bytes for an integer in an INT32 format. A data group length (namely, a compression block) is related to data content that is compressed, the compression algorithm, and the like. In this disclosure, one compression means compression of one data group.

For example, for Huffman coding, when a string is compressed by single character, one data group is one character.

For another example, for run length coding, it is assumed that to-be-compressed data is "AAAABBB". During the $1^{st}$ compression, a data group is "AAAA", and a data group length corresponding to the $1^{st}$ compression is four characters. During the $2^{nd}$ compression, a data group is "BBB", and a data group length corresponding to the $2^{nd}$ compression is three characters.

(9) A decompression engine is hardware that implements data decompression, for example, an integrated circuit or a field programmable gate array (FPGA). The decompression engine corresponds to a compression algorithm, and can decompress only data compressed by using a specified compression algorithm.

(10) A standard compressed data block has a fixed length, namely, L2, and is a data block that can be completely processed (decompressed) by a single decompression engine in a decompression device within one processing cycle. A size of a raw data block obtained by decompressing the standard compressed data block is not greater than L1. L1 and L2 are integers greater than 1, and L1 is greater than L2.

(11) A processing cycle may be one clock cycle or a plurality of clock cycles. A single decompression engine can completely process a compressed data block with a maximum length of L2 within one processing cycle.

(12) Independent compression: S raw data blocks are independently compressed, to obtain S compressed data blocks that one-to-one correspond to the S raw data blocks. There is no correlation between the S compressed data blocks (that is, a raw data block is compressed not based on another raw data block), and the S compressed data blocks may be independently decompressed (that is, a compressed data block is decompressed not based on another compressed data block).

For example, raw data consists of a raw data block A and a raw data block B. When the raw data is compressed, when the raw data block A is compressed by using a compression algorithm, the compression is performed from the $1^{st}$ data group of the raw data block A. After the raw data block A is completely compressed, a compressed data block A' is obtained. When the raw data block B is compressed, the compression is performed from the $1^{st}$ data group of the raw data block B. After the raw data block B is completely compressed, a compressed data block B' is obtained. When the compressed data block A' and the compressed data block B' are decompressed, the compressed data block A' and the compressed data block B' may be separately decompressed, may be decompressed in any order, or may be decompressed at the same time.

Figure 2:
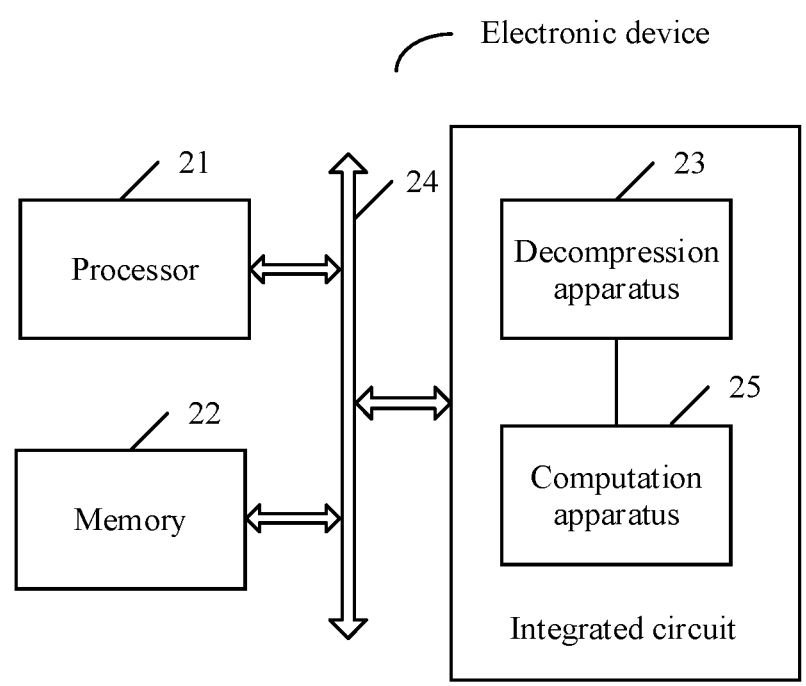
FIG. 2 is a schematic diagram of an architecture of an electronic device according to an embodiment of the present disclosure.

FIG. 2 is a schematic diagram of an architecture of an electronic device according to an embodiment of the present disclosure. The electronic device may include a processor 21, a memory 22, and a decompression apparatus 23. The processor 21 may be connected to the memory 22 and the decompression apparatus 23 through a bus 24.

The memory 22 may be a read-only memory (ROM), a random access memory (RAM), or another memory. In this embodiment of this disclosure, the memory 22 is configured to store raw data and various software programs, for example, a data compression program in this disclosure. In an embodiment of this disclosure, the memory 22 may be a DDR memory, to improve a data transmission rate between the memory and the processor or between the memory and the decompression apparatus.

The processor 21 is a control center of a computer device. In this disclosure, the processor is a circuit having a processing capability or a set of a plurality of circuits having a processing capability. For example, the processor may be an instruction set-based processor (also referred to as a "software processor") such as a central processing unit (CPU), or may be a processing circuit (also referred to as a "hardware processor") implemented based on hardware such as an application-specific integrated circuit (ASIC) or a field programmable gate array (FPGA). When the processor is the instruction set-based processor, the processor 21 may execute various functions of the electronic device by running or executing the software programs stored in the memory of the computer device and invoking data stored in the memory. When the processor is an FPGA-based processor, a corresponding function may be implemented by reading a configuration file to configure an FPGA circuit. When the processor is the circuit implemented based on the ASIC, the ASIC may be designed to have corresponding circuit functions to perform these functions after power-on. In this disclosure, the processor 21 may be encapsulated into one chip alone or together with another circuit, or may be encapsulated into several chips (for example, encapsulated into a plurality of chips for different functional circuits). This is not limited in this disclosure.

In this embodiment of this disclosure, the processor 21 may invoke the raw data and the data compression program that are stored in the memory 22, to implement the data compression method in the embodiments of this disclosure.

The bus 24 may be an AXI bus, a peripheral component interconnect (PCI) bus, an extended industry standard architecture (EISA) bus, or the like. The bus may be classified into an address bus, a data bus, a control bus, and the like.

Figure 3:
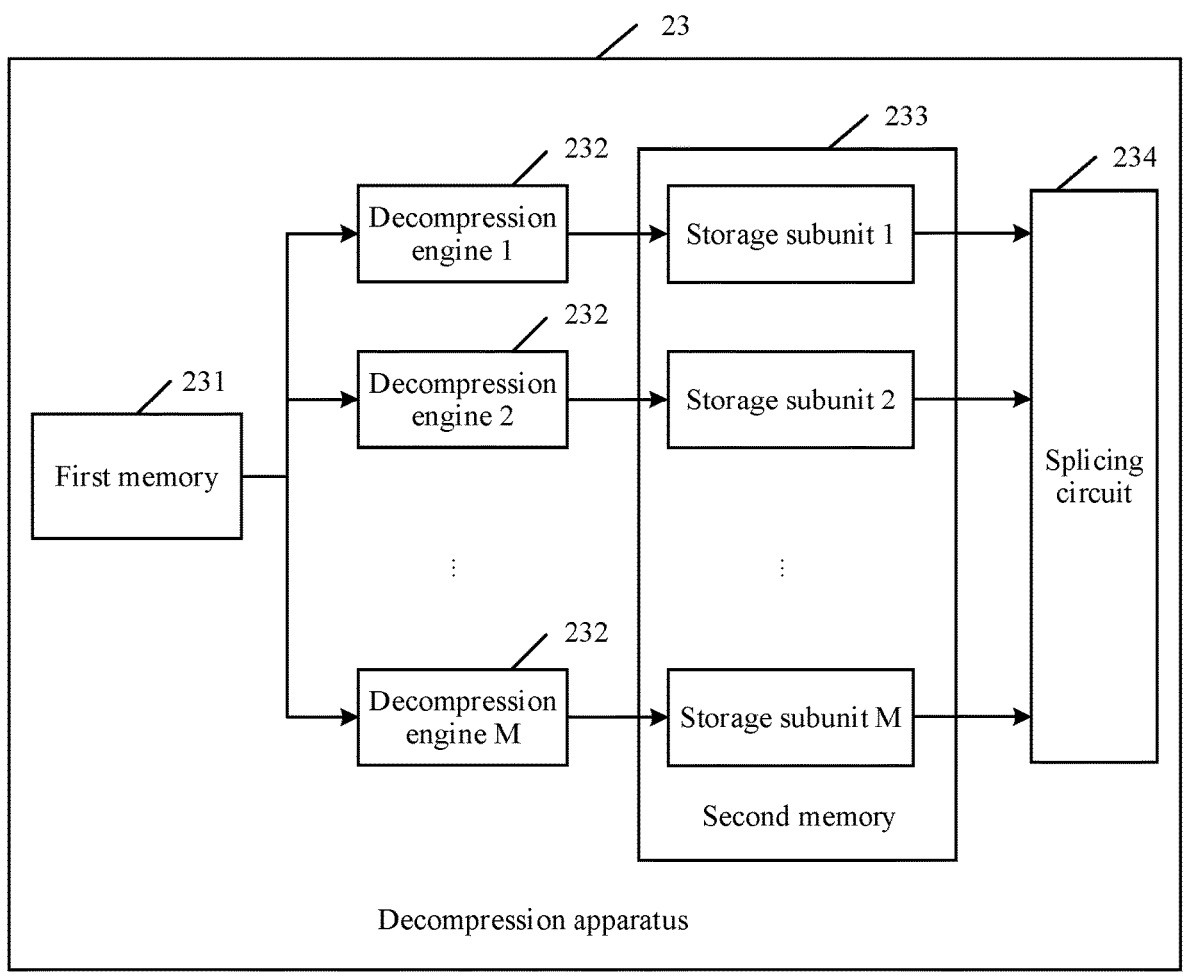
FIG. 3 is a schematic structural diagram of a decompression apparatus according to an embodiment of the present disclosure.

Refer to a schematic structural diagram of the decompression apparatus in FIG. 3. The decompression apparatus 23 may include a first memory 231, M decompression engines 232, a second memory 233, a splicing circuit 234, and the like. The processor 21 may further control startup of the decompression apparatus 23 through the bus 24. The decompression apparatus 23 may obtain a compressed data block from the memory 22 through the bus 24, and decompress the compressed data block in real time by using a decompression engine. To accelerate decompression, the decompression apparatus may specifically complete the decompression based on a hardware processor such as an ASIC or an FPGA, and certainly, may complete the decompression based on a software processor such as a CPU. This is not limited in this disclosure.

The first memory 231 is an ingress memory of the decompression apparatus, and is configured to store a received compressed data block. Optionally, the first memory 231 may include M storage subunits that one-to-one correspond to the M decompression engines, and one storage subunit may store one compressed data block, for example, one standard compressed data block. In an embodiment of this disclosure, the compressed data block may alternatively be a compressed data block obtained by compressing a raw data block with a length not greater than L1. In other words, L2 may be determined as a length of data that can be stored in any one storage subunit in the first memory.

The M decompression engines are configured to decompress in parallel standard compressed data blocks stored in the first memory, and one decompression engine is configured to decompress one standard compressed data block.

In a specific implementation of this embodiment of this disclosure, the M decompression engines include N decompression engines. The N decompression engines may be respectively used to decompress in parallel N standard compressed data blocks, to obtain N raw data blocks. Each of the N decompression engines 232 is configured to: obtain one of the N standard compressed data blocks, and decompress the obtained standard compressed data block, to obtain the N raw data blocks N that one-to-one correspond to the N standard compressed data blocks. A length of any one of the N raw data blocks may be not greater than L1.

The second memory is an egress memory of the decompression apparatus, and is configured to store the N raw data blocks. Optionally, the second memory includes M storage subunits that one-to-one correspond to the M decompression engines. A storage subunit is configured to store a raw data block obtained, through decompression, by a decompression engine corresponding to the storage subunit. In other words, L1 may be determined as a length of data that can be stored in any one storage subunit in the second memory.

It may be understood that a size of the ingress memory of the decompression apparatus is a sum of sizes of ingress memories of the M decompression engines included in the decompression apparatus. A size of the egress memory of the decompression apparatus is a sum of sizes of egress memories of the M decompression engines included in the decompression apparatus.

The splicing circuit is configured to splice raw data blocks (for example, the N raw data blocks) stored in the second memory, to obtain raw data. The splicing circuit is not a mandatory component of the decompression apparatus. The decompression apparatus may not include the splicing circuit, and data is spliced by using software. This is not limited in this embodiment of this disclosure.

In an embodiment of this disclosure, the N decompression engines include a decompression engine i, the N compressed data blocks include a compressed data block i, the N raw data blocks include a raw data block i obtained by decompressing the compressed data block i is a positive integer, and i is not greater than N; and the decompression engine i is specifically configured to decompress the compressed data block i. Further, when a length of the raw data block i obtained by the decompression engine i through decompression is equal to L1, the decompression operation performed on the compressed data block i is stopped, and the raw data block i is output. Alternatively, when the decompression engine i identifies an invalid flag, the decompression operation performed on the compressed data block i is stopped, and the raw data block i obtained through decompression is output.

Alternatively, a first decompression engine is any one of the N decompression engines, and a first standard compressed data block is any one of the N standard compressed data blocks. A decompression process performed by any one decompression engine is described by using an example in which the first decompression engine decompresses the first standard compressed data block. Specifically, the decompression apparatus may decompress the first standard compressed data block by using the first decompression engine; and when a length of a raw data block obtained by the first decompression engine through decompression is equal to L1, stop the decompression operation performed by the first decompression engine on the first standard compressed data block, and output the raw data block; or when the first decompression engine identifies an invalid flag, stop the decompression operation performed by the first decompression engine on the first standard compressed data block, and output a raw data block currently obtained through decompression.

In an embodiment of this disclosure, the decompression apparatus further includes a control circuit, configured to: when the length of the raw data block obtained by the first decompression engine in the N decompression engines through decompression is equal to L1, stop the decompression operation performed by the first decompression engine on the obtained compressed data block.

Optionally, the decompression apparatus may further include a data distribution circuit. The data distribution circuit is configured to sequentially distribute the N compressed data blocks stored in the first memory to the N decompression engines.

It should be noted that one storage subunit in the first memory and/or one storage subunit in the second memory may be disposed in a corresponding decompression engine. This is not limited in this embodiment of this disclosure.

Optionally, the electronic device may further include an operation apparatus. The operation apparatus is coupled to the decompression apparatus and the processor, and is configured to perform data processing based on the raw data obtained by the decompression apparatus through decompression.

In specific implementation, the operation apparatus may be a specific integrated circuit, for example, hardware that runs a machine learning algorithm, or hardware that runs a video or image processing algorithm. The processor may further control startup of the decompression apparatus and the operation apparatus through the bus. The decompression apparatus may obtain a compressed data block from the memory through the bus, respectively decompress a plurality of compressed data blocks in real time by using a plurality of decompression engines, to obtain raw data corresponding to the plurality of compressed data blocks, and input the raw data into the operation apparatus. The operation apparatus completes computation based on the raw data. For example, the operation apparatus performs training or inference on the raw data by using a machine learning model.

The operation apparatus may be one or more microprocessors, may be one or more field programmable gate arrays (FPGA), or the like, and is configured to implement a specific computation function of a computation module.

In an embodiment of the present disclosure, the operation apparatus and the decompression apparatus may form an integrated circuit. The integrated circuit, the processor, and the memory may be integrated into a same chip. Alternatively, the integrated circuit may be used as an independent chip and applied to the electronic device to accelerate, by using hardware, computation.

The electronic device in FIG. 2 may run both the data compression method in this disclosure and the data decompression method corresponding to the data compression method. However, in an embodiment of this disclosure, an electronic device (also referred to as a first electronic device in this disclosure) that performs the data compression method may include neither the operation apparatus nor the decompression apparatus. Likewise, a processor in an electronic device (for example, a second electronic device) that performs the data decompression method may not run the data compression method.

It should be noted that, for specific implementation of performing a data compression function by the electronic device and the first electronic device, refer to related descriptions in the following data compression method embodiment; and for specific implementation of performing a data decompression function by the second electronic device, refer to related descriptions in the following data decompression method embodiment. Details are not described in this embodiment of this disclosure.

The following describes in detail the data compression method in the embodiments of the present disclosure, as shown in a schematic flowchart of the data compression method in FIG. 4, and in a schematic illustration of the data compression method in FIG. 5. The data compression method is performed by a first electronic device or a compression apparatus. The first electronic device may be the electronic device shown in FIG. 2, or may be another first electronic device in the embodiments of this disclosure. The following provides description by using an example in which the data compression method is performed by the compression apparatus. The data compression method is used to compress raw data into one or more standard compressed data blocks that each have a length of L2 and that are to be decompressed in parallel by a decompression apparatus. The decompression apparatus includes a plurality of decompression engines, each decompression engine is capable of decompressing one standard compressed data block within one processing cycle, and L2 is an integer greater than 1. In a process of compressing the raw data, the compression apparatus may compress a raw data block for one or more times. The compressing a raw data block may include: processing, by the compression apparatus, the raw data block based on a compression algorithm to obtain a standard compressed data block corresponding to the raw data block, where the raw data block is data included in the raw data.

In the embodiments of this disclosure, a process of compressing one raw data block is used as an example for description. A specific implementation of the compression may be: independently compressing the raw data block based on a compression algorithm to obtain a compressed data block corresponding to the raw data block, where a length d of the compressed data block is not greater than L2; and further appending additional data with a length of L2-$d$ to the compressed data block, to generate a standard compressed data block with a length of L2, where d is an integer greater than 0. It should be understood that d merely indicates a length of a compressed data block. Actual values of d may be different for different compressed data blocks.

In another implementation of the embodiments of this disclosure, a method for compressing raw data may include all or some of the following blocks.

Block S41: Independently compress each of S consecutive raw data blocks in raw data based on a compression algorithm to obtain S compressed data blocks, where the raw data blocks one-to-one correspond to the compressed data blocks. Each of the S raw data blocks includes a plurality of pieces of consecutive data in the raw data, a length of the plurality of pieces of consecutive data is not greater than L1, a length d of each of the S compressed data blocks is not greater than L2, and S is a positive integer.

Figure 6A:
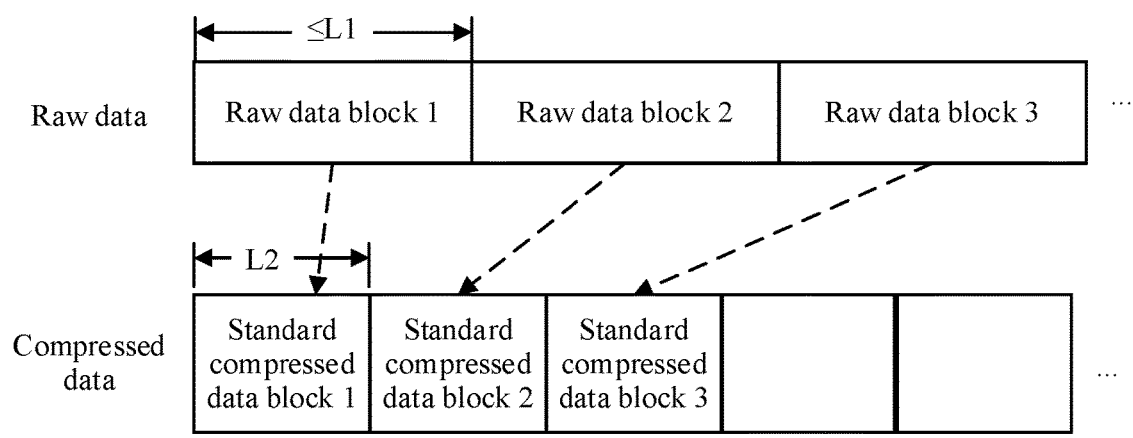
FIG. 6A is a schematic illustration of raw data and compressed data according to an embodiment of the present disclosure.

The raw data may be data in a file form, or may be data in a non-file form (for example, some data stored in a memory). The raw data includes a plurality of raw data blocks, and the plurality of raw data blocks are sequentially connected to form the raw data. The "data block" is a set of a plurality of pieces of data. In the computer application field, one or more bits may be used to represent one piece of data, in other words, a data block may include a plurality of bits. A length of each of the plurality of raw data blocks is not greater than L1. A length of a compressed data block corresponding to each raw data block is not greater than L2. It should be understood that different raw data blocks may have different lengths. For details, refer to a schematic illustration of raw data and compressed data in FIG. 6A.

Optionally, before the block S41, the method may further include the following block:

Block S40: Determine L1 as an egress bit width of a single decompression engine and L2 as an ingress bit width of a single decompression engine.

In this block, the "determining" may be implemented by preconfiguring L1 and L2 (for example, configuring specific values of L1 and L2 in program code or circuit implementation), or by reading related configuration values when a program or a hardware circuit runs (for example, determining values of L1 and L2 by reading a configuration file that is locally or remotely stored and that records the values of L1 and L2).

It may be understood that, in this disclosure, the values of L1 and L2 may be determined based on support of hardware of a compression system for compression. In other words, these thresholds need to be supported by the hardware, and need to enable hardware resources to be maximally used. For example, L1 relates to the raw data block. Therefore, it needs to be ensured that an egress memory (that is, a memory configured to store decompressed data) of a decompression engine can accommodate data obtained through decompression during final parallel decompression. In other words, a size of the egress memory of the decompression engine is not less than that of egress bandwidth (that is, a maximum quantity of data bits that can be stored after a standard compressed data block is decompressed within one processing cycle) of the decompression engine. Therefore, L1 needs to be less than or equal to the egress bit width of the single decompression engine. L1 may be equal to the egress bit width of the single decompression engine to maximize utilization. Likewise, it needs to be ensured that an ingress memory of a single decompression engine can accommodate compressed data. In other words, a size of the ingress memory of the decompression engine is not less than that of ingress bandwidth (that is, a width of data that can be read by one decompression engine within one processing cycle, for example, a bit width is 64 bits if 8 bytes are read each time) of the decompression engine. Therefore, L2 may be set to the ingress bit width of the single decompression engine to maximize the utilization.

It should be understood that the ingress bit width of the single decompression engine may be a storage size that can be allocated by a first memory to a single decompression engine or a size of a storage subunit that is in a first memory and that corresponds to a single decompression engine.

The egress bit width, L1, the ingress bit width, and L2 may be in units of bit.

A person skilled in the art may understand that the egress bit width and the ingress bit width may be determined based on specific software and hardware and performance indicators that a compression and decompression system needs to meet, for example, may be determined based on one or more of the following factors: a compression algorithm used by a decompression engine, a circuit design of the decompression engine, a length of data that can be input into a decompression apparatus within each clock cycle, a quantity, an area, power consumption of decompression engines in the decompression apparatus, and the like. For example, if a dominant frequency of the hardware is f, and ingress bandwidth allocated to the decompression apparatus is b, data entering the decompression apparatus within each clock cycle is b/f. If it is known that a decompression capability of a single decompression engine is c bytes/clock cycle (byte/cycle), at least b/(f*c) decompression engines are required. Likewise, if it is known that the decompression capability of the single decompression engine is c bytes/clock cycle, and the decompression apparatus includes M decompression engines, data entering the decompression apparatus within each clock cycle is c*M bytes. Therefore, the first memory in the decompression apparatus needs to be capable of storing the data that enters the decompression apparatus within each clock cycle, and the ingress memory of the single decompression engine needs to be capable of storing data that enters the decompression engine within each clock cycle, namely, c bytes.

For example, if the dominant frequency of the hardware is 1 GHz, and the ingress bandwidth allocated to the decompression apparatus is 32 GBps, the data entering the decompression apparatus within each clock cycle is 32 bytes. If it is known that the decompression capability of the single decompression engine is eight bytes/clock cycle (byte/cycle), the decompression apparatus requires at least four decompression engines, and a size of a storage resource corresponding to a single decompression engine is not less than eight bytes.

The egress bit width of the single decompression engine is greater than the ingress bit width of the single engine. The egress bit width of the single engine may be equal to a storage size that is allocated by a second memory in the decompression apparatus to a single decompression engine or a size of a storage subunit that is in a second memory unit and that corresponds to a single decompression engine.

Optionally, the ingress bit width of the single decompression engine may be set to a maximum length of a compressed data block that can be decompressed by a single decompression engine within one clock cycle. Likewise, the egress bit width of the single decompression engine may be set to a maximum length of raw data that can be obtained by a single decompression engine through decompression within one clock cycle.

Optionally, a compression apparatus may obtain a specification parameter of the decompression apparatus, where the specification parameter includes an egress bit width, an ingress bit width, the quantity of decompression engines, and the like. Further, it is determined that L1 is less than or equal to the egress bit width of the single decompression engine and L2 is less than or equal to the ingress bit width of the single decompression engine.

It should be noted that L1 may alternatively be less than the egress bit width of the single decompression engine and L2 may alternatively be less than the ingress bit width of the single decompression engine.

Block S42: Append additional data with a length of L2-$d$ to each of the S compressed data blocks to generate S standard compressed data blocks that each have a length of L2. One standard data block with the length of L2 can be completely decompressed by a single decompression engine in the decompression apparatus within one processing cycle. L1 and L2 are integers greater than 1, $d$ is an integer greater than 0, and L1 is greater than L2.

A first raw data block is any one of the S raw data blocks, and a first compressed data block is data that is in the S compressed data blocks and that is obtained by compressing the first raw data block. When a length of the first compressed data block is equal to L2, d is L2. That is, the compression apparatus does not need to append additional data to the first compressed data block, and the first compressed data block is a desired standard compressed data block with the length of L2.

It may be understood that lengths of additional data in standard compressed data blocks obtained by compressing different raw data blocks may be different.

Figure 6B:
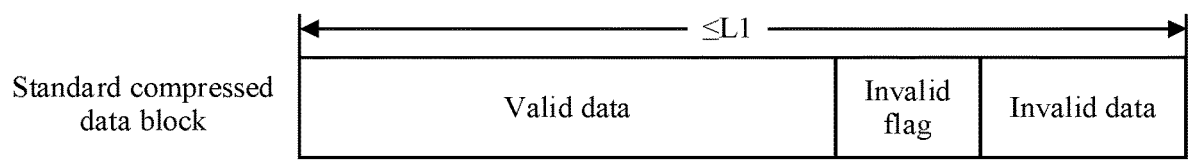
FIG. 6B is a schematic structural diagram of a standard compressed data block according to an embodiment of the present disclosure.

The additional data may be added in the following three manners:

In a first manner, when a length y of the first raw data block is equal to L1, additional data in the standard compressed data block obtained by compressing the first raw data block may be randomly padded. During decompression by a decompressor, the decompressor retains only data that has a length of L1 and that starts from the beginning of the standard compressed data block, and all remaining data may be discarded. For example, the additional data is a valid codeword (case (1)), or includes an invalid flag and invalid data (case (2)), where the invalid flag is used to indicate that the additional data needs to be discarded, and the invalid data is located behind the invalid flag. A quantity of bits of the invalid data located behind the invalid flag may be 0 or not less than 1. The quantity of bits of the invalid data is determined based on a length of the data obtained by compressing the first raw data block. A sum of the length of the data obtained by compressing the first raw data block, the quantity of bits of the invalid data, and a quantity of bits of the invalid flag is L2, to ensure that the standard compressed data block with the length of L2 can be obtained. Referring to a schematic structural diagram of a standard compressed data block in FIG. 6B, a valid codeword is a codeword that can be identified and decompressed by a decompression engine. When the additional data is the valid codeword (namely, case (1)), although the decompression engine can identify and decompress the additional data, because the length of the first raw data block is L1, the decompression engine can extract only data with a maximum length of L1, and all data obtained by decompressing the additional part may be discarded. For case (2), the invalid flag may consist of a plurality of bits, and a specific quantity of bits depends on a decompression algorithm. The quantity of bits of the invalid flag varies with a specific decompression algorithm. Regardless of which algorithm is used, it only needs to be ensured that the decompression engine can identify the invalid flag, learn of that data starting from the invalid flag is invalid, and discard the data. The decompression engine does not decompress the data located behind the invalid flag. Therefore, the invalid data padded behind the invalid flag is not limited, and may be any data.

In a second manner, when a length y of the first raw data block is less than L1, additional data includes an "invalid flag" and "invalid data", as described in the first manner. In this manner, y is less than L1. Therefore, if a manner of padding a valid codeword is used, a decompressor cannot output a decompression result (unlike in the first manner in which data with a length of L1 may be uniformly obtained, in this manner, a length of valid data obtained through decompression is unknown). Therefore, the "invalid flag +invalid data" manner needs to be used to stop decompression. In this case, data that is obtained through decompression and that is located before the invalid flag is the raw data block. It should be noted that, in another embodiment, if the length of the raw data block can be known in a manner, the additional data may also be added by padding the valid codeword. It may be understood that, when the manner of adding the invalid flag is used, a same set of software code may be used in both the first manner and the second manner. This facilitates processing and reduces design costs.

The foregoing two manners are applicable to a case in which a processing cycle is one or more clock cycles.

In a third manner, when the processing cycle is a plurality of clock cycles, additional data in the standard data block obtained by compressing the first raw data block may include an invalid flag and invalid data (case (3)). The invalid flag is used to indicate that the additional data needs to be discarded, the invalid data is located behind the invalid flag, and a quantity of bits of the additional data located behind the invalid flag may be 0 or not less than 1.

For the valid codeword mentioned in the foregoing two manners, refer to the following table. For example, if Huffman coding is used in the compression algorithm, valid codewords in one code are shown in the following Table 1.

TABLE 1

| Code length (bit) | Code (binary) |
|---|---|
| 2 | 00 |
| 3 | 001 |
| 3 | 011 |
| 3 | 100 |
| 3 | 101 |
| 3 | 110 |
| 5 | 11100 |
| 5 | 11101 |
| 5 | 11110 |
| 6 | 111110 |
| 6 | 111111 |

Based on a value of L2-d, the compression apparatus may determine that the valid codeword is a code corresponding to a code length of L2-d in Table 1, or determine that the valid codeword is a combination of a plurality of codes whose total length is L2-d in Table 1.

It should be noted that Table 1 is merely used to describe a principle of selecting a valid codeword. In this embodiment of this disclosure, another valid code or a combination of valid codes may be used based on a specific compression algorithm.

In the foregoing embodiment, when the raw data is compressed, a length of each of a plurality of generated standard compressed data blocks is a fixed value, namely, L2, and a length of a raw data block corresponding to the generated standard compressed data block is not greater than L1. This standardizes a length of a compressed data block obtained by compressing the raw data, and each standard compressed data block is obtained through independent compression, and further may be independently decompressed. In this way, various decompression engines can synchronously decompress the plurality of standard compressed data blocks. This improves data decompression efficiency.

In addition, compared with a variable-length compressed data block obtained through compression, the standard compressed data block with the fixed length of L2 is set in this disclosure. In this way, a compressor does not need to record a length of each compressed data block, and the decompressor does not need to record a length of obtained data either. This simplifies a design of the decompressor.

Further, in the prior art, a quantity of raw data blocks into which raw data is divided is equal to a quantity of decompression engines, that is, the quantity of decompression engines limits a granularity level at which the raw data can be divided. As a result, a plurality of compressed data blocks obtained by compressing the raw data are relatively long. When data at a random address is accessed, a compressed data block in which the data at the random address is located needs to be decompressed. In a decompression process, because data in the compressed data block is associated, the compressed data block can be decompressed by only one decompression engine. This cannot implement multiple-speed decompression for compressed data. In this embodiment of this disclosure, the granularity level at which the raw data can be divided is irrelevant to the quantity of decompression engines, and the raw data may be compressed into a large quantity of relatively small standard compressed data blocks. When the data at the random address is accessed, a plurality of consecutive standard compressed data blocks in which the data at the random address is located are input into a plurality of decompression engines for decompression. This can implement multiple-speed decompression for compressed data at the random address.

The following describes an implementation of the block S41 by using an example in which the compression apparatus independently compresses the first raw data block based on the compression algorithm to obtain the first compressed data block. The first raw data block is a raw data block in the raw data. It may be understood that the block S41 may alternatively be implemented in another manner. This is not limited in this embodiment of this disclosure.

In a First Implementation:

Generally, data compression is performed by using a data group as a step. The data group may be one piece of compressible data or a plurality of pieces of consecutive compressible data, and is a compressible unit supported by the compression algorithm. A length of the data group is determined based on the compression algorithm and data content in the data group, and is less than or equal to L1. In addition, a length of a data block generated by compressing a single data group is less than or equal to L2. For a specific implementation, refer to the prior art. Details are not described in this disclosure.

The First Implementation of the Block S41 includes the following Procedure:

S1: The compression apparatus obtains a to-be-compressed data group from the raw data.

The to-be-compressed data group may be the $1^{st}$ data group in the first raw data block or a next to-be-compressed data group after a data group in the first raw data block is compressed for one or more times. The data group includes data including one or more bits.

S2: Determine whether the to-be-compressed data group needs to be compressed; and if the to-be-compressed data group needs to be compressed, perform block S3, or if the to-be-compressed data group does not need to be compressed, perform S4.

The determining whether the to-be-compressed data group needs to be compressed includes: determining whether a sum of a total length x of one or more data groups that have been compressed and a length $\Delta x$ of the to-be-compressed data group is not greater than L1, and determining whether a length y of a compressed data block generated after the to-be-compressed data group is compressed is not greater than L2. A person skilled in the art may understand that a length of a compressed data block generated after a data group is compressed is a sum of a length of an original compressed data block and a length increased in the current compression. In other words, the length of the compressed data block is updated after each data group is compressed.

(1) If $x+\Delta x \leq L1$ and $y \leq L2$, it is determined that compression needs to be performed.

If the sum of the total length x of the one or more data groups that have been compressed and the length $\Delta x$ of the to-be-compressed data group is not greater than L1, and the length of the compressed data block generated after the to-be-compressed data group is generated is not greater than L2, it indicates that the length of the compressed data block obtained after one more compression is still not greater than L2. In other words, the to-be-compressed data group may be compressed, and it is determined that compression needs to be performed.

(2) If $x+\Delta x \leq L1$ and $y > L2$, it is determined that no compression needs to be performed.

If the sum of the total length x of the one or more data groups that have been compressed and the length $\Delta x$ of the to-be-compressed data group is not greater than L1, and the length of the compressed data block generated after the to-be-compressed data group is compressed is greater than L2, it indicates that after one more compression, the sum of the total length x of the one or more data groups that have been compressed and the length $\Delta x$ of the to-be-compressed data group is still less than L1, but the length of the obtained compressed data block is greater than L2. Therefore, it is determined that no compression needs to be performed. In this case, the compression on the to-be-compressed data group needs to be stopped, and block S4 is performed.

(3) If $x+\Delta x > L1$, it is determined that no compression needs to be performed.

If the sum of the total length x of the one or more data groups that have been compressed and the length $\Delta x$ of the to-be-compressed data group is greater than L1, it indicates that the sum of the total length x of the one or more data groups that have been compressed and the length $\Delta x$ of the to-be-compressed data group after one more compression exceeds L1. Therefore, it is determined that no compression needs to be performed. In this case, the compression on the to-be-compressed data group needs to be stopped, and block S5 is performed.

S3: Compress the to-be-compressed data group, and perform S1 after the compression is completed.

S4: Use data currently obtained through compression as the first compressed data block. In this case, a data group that is currently compressed is the first raw data group.

It should be noted that, when the to-be-compressed data group does not need to be compressed, the to-be-compressed data group needs to be put back into the raw data and is used as the $1s^t$ data group of a next to-be-compressed raw data block.

It should be understood that, in this disclosure, the raw data is compressed into the S standard compressed data blocks, and the $1^{st}$ data group is the $1^{st}$ data group in the first raw data block.

It should be understood that the compression apparatus may first determine values of $x+\Delta x$ and L1, and then determine values of y and L2.

Figure 7:
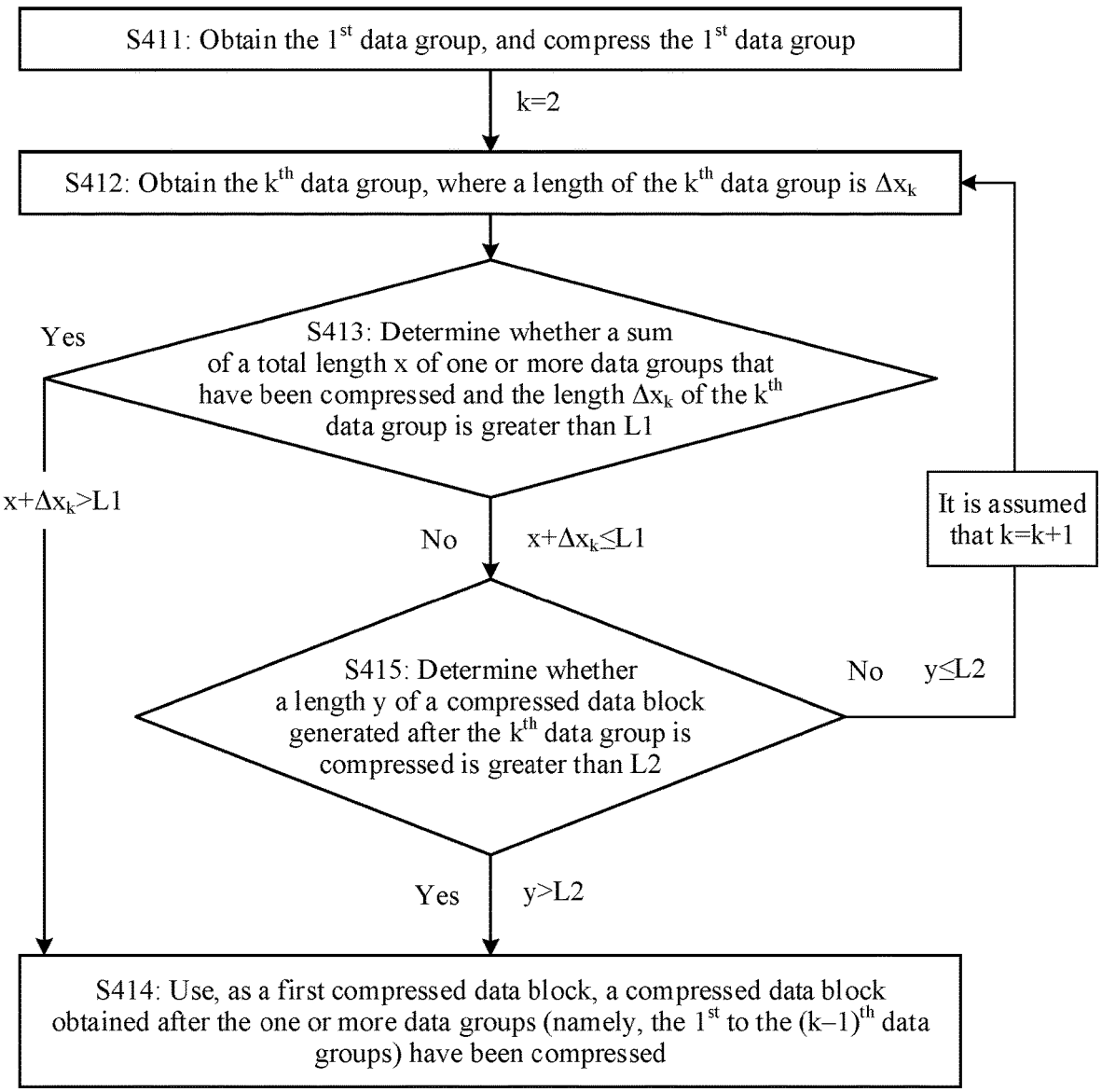
FIG. 7 is a schematic flowchart of a method for implementing block S41 according to an embodiment of the present disclosure.

For example, FIG. 7 is a schematic flowchart of an implementation method for independently compressing the first raw data block based on the compression algorithm to obtain the first compressed data block. The method includes the following procedure.

S411: The compression apparatus obtains the $1^{st}$ data group, and compresses the $1^{st}$ data group.

A length Δx of a data group is not greater than L1, and a data block obtained by compressing a single data group is not greater than L2. Therefore, after obtaining the $1^{st}$ data group, the compression apparatus may perform compression by default. Alternatively, when obtaining the $1^{st}$ data group, the compression apparatus may determine whether the $1^{st}$ data group needs to be compressed. In this case, the $1^{st}$ data group needs to meet a compression condition. Further, it is assumed that block S412 is performed when k=2, where k is a positive integer, and k≤M.

S412: The compression apparatus obtains the $k^{th}$ data group, where a length of the $k^{th}$ data group is $\Delta x_k$.

Optionally, the compression apparatus may first determine whether a sum of a length x of one or more data groups that have been compressed and the length $\Delta x_k$ of the $k^{th}$ data group is not greater than L1.

S413: The compression apparatus determines whether the sum of the total length x of the one or more data groups that have been compressed and the length $\Delta x_k$ of the $k^{th}$ data group is greater than L1. It may be understood that the total length x of the one or more data groups is a length obtained by adding up a length of each data group in the one or more data groups.

The one or more data groups that have been compressed are the $1^{st}$ to the $(k-1)^{th}$ data groups.

When $x+\Delta x_k>L1$, it indicates that after the $k^{th}$ data group is compressed, a length of the $1^{st}$ to the $k^{th}$ data groups may exceed L1. In this case, the $k^{th}$ data group does not need to be compressed, compression of the $k^{th}$ data group needs to be stopped, and block S414 is performed. When $x+\Delta x_k \leq L1$, it indicates that after the $k^{th}$ data group is compressed, a length of the $1^{st}$ to the $k^{th}$ data groups is less than or equal to L1, and block S415 is performed.

S414: Use, as the first compressed data block, a compressed data block obtained after the one or more data groups (namely, the $1^{st}$ to the $(k-1)^{th}$ data groups) have been compressed. In this case, the one or more data groups that have been compressed (namely, the $1^{st}$ to the $(k-1)^{th}$ data groups) are the first raw data block in block S41.

S415: Determine whether a length y of a compressed data block generated after the $k^{th}$ data group is compressed is greater than L2.

When y'>L2, it indicates that the length y of the compressed data block generated after the $k^{th}$ data group is compressed is greater than L2. In this case, it is determined that the $k^{th}$ data group does not need to be compressed, and S414 may be performed. When y≤L2, it indicates that the length y of the compressed data block generated after the $k^{th}$ data group is compressed is not greater than L2, and the $k^{th}$ data group needs to be compressed. In this case, it is assumed that k=k+1, and the block S412 is performed again.

It should be noted that, for one or more to-be-compressed data groups, if that a corresponding parameter meets a specific condition can be agreed in advance to ensure that a condition for performing compression for one or more times can be met (For example, L1 is far greater than a data group length, and L2 is also relatively large. Even after compression is performed for one or more times, data that is compressed does not exceed L1, and a length of a compressed data block does not exceed L2), the determining may not be performed, and the one or more pieces of data are directly compressed for one or more times correspondingly.

Figure 8:
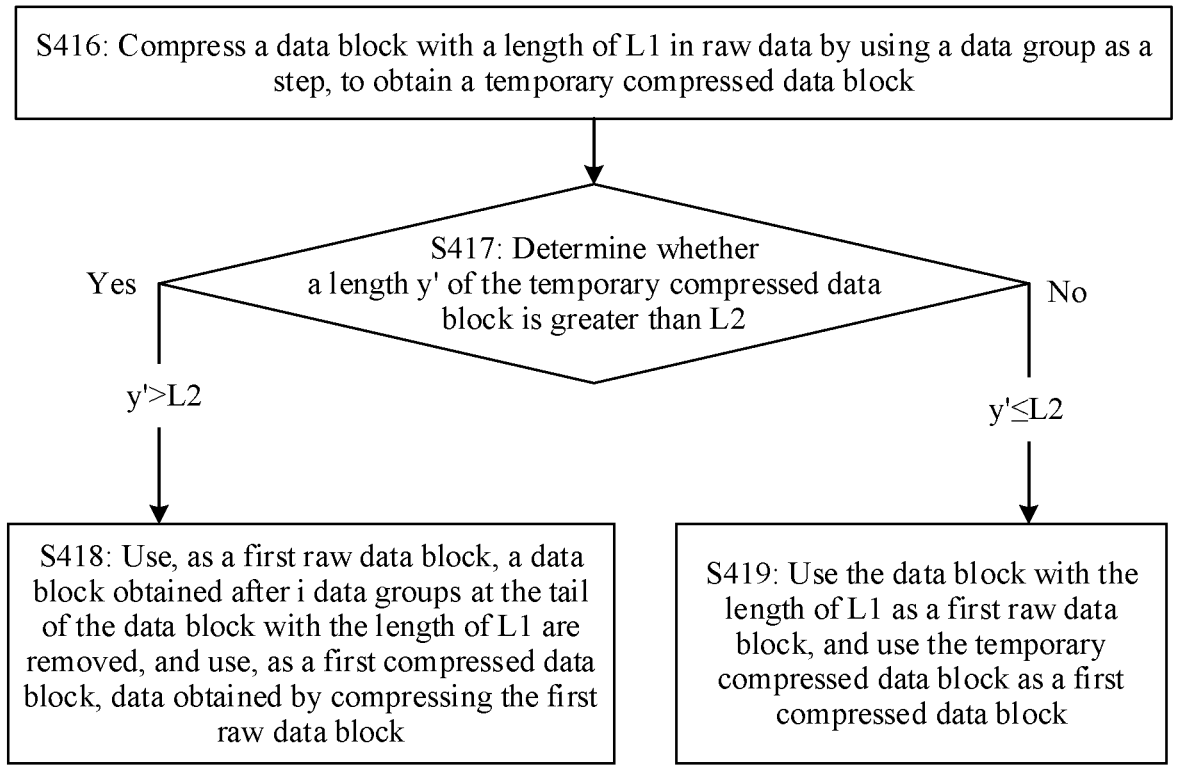
FIG. 8 is a schematic flowchart of another method for implementing block S41 according to an embodiment of the present disclosure.

In a Second Implementation:

FIG. 8 is another schematic flowchart of independently compressing the first raw data block based on the compression algorithm to obtain the first compressed data block in an embodiment of the present disclosure. The implementation may include the following blocks.

Block S416: Compress a data block with a length of L1 in the raw data by using a data group as a step, to obtain a temporary compressed data block.

Block S417: Determine whether a length y' of the temporary compressed data block is greater than L2.

When y'>L2, it indicates that the length of the temporary compressed data block obtained by compressing the data block with the length of L1 is greater than L2, in other words, is greater than the length of the standard compressed data block. In this case, block S418 is performed. When y'≤L2, block S419 is performed.

Block S418: Use, as the first raw data block, a data block obtained after i data groups at the tail of the data block with the length of L1 are removed, and use, as the first compressed data block, data obtained by compressing the first raw data block. The length of the first compressed data block is not greater than L2.

Optionally, i may be a minimum positive integer that makes the length of the first compressed data block not greater than L2. A method for determining i may be: removing, by the compression apparatus, data groups one by one from the tail of the data block with the length of L1, until a length of a compressed data block obtained by compressing a data block that is obtained after the $i^{th}$ data group is removed from the data block with the length of L1 is not greater than L2.

It should be noted that the removed i data groups need to be put back into the raw data and are used as the $1^{st}$ data group of a next to-be-compressed raw data block.

Block S419: Use, as the first raw data block, the data block with the length of L1, and use the temporary compressed data block as the first compressed data block. The compression apparatus may perform the block S42.

In the embodiment shown in FIG. 8, the compression apparatus compresses, by using the data group as the step, a data block with a length of L1 in to-be-compressed data, to obtain a temporary compressed data block, compares a length y' of the temporary compressed data block with L2, determines, based on a comparison result, a first raw data block and a first compressed data block that is generated by compressing the first raw data block, to obtain a first compressed data block that meets a requirement, and further obtain a standard compressed data block with the fixed length of L2.

Figure 9:
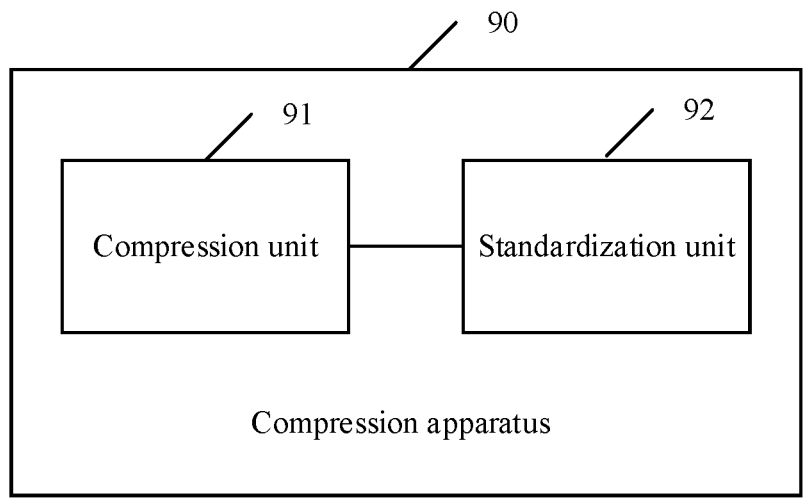
FIG. 9 is a schematic structural diagram of a compression apparatus according to an embodiment of the present disclosure.

FIG. 9 is a schematic structural diagram of a compression apparatus according to an embodiment of the present disclosure. The compression apparatus 90 is configured to compress raw data into one or more standard compressed data blocks that each have a length of L2 and that are to be decompressed in parallel by a decompression apparatus, where the decompression apparatus includes a plurality of decompression engines, each decompression engine is capable of decompressing one standard compressed data block within one processing cycle, and L2 is an integer greater than 1. The compression apparatus 90 includes:

a processing module, configured to process a raw data block based on a compression algorithm to obtain the standard compressed data block corresponding to the raw data block, where the raw data block is data included in the raw data.

In an implementation of this embodiment of this disclosure, the processing module may include:

a compression unit 91, configured to independently compress the raw data block based on the compression algorithm to obtain a compressed data block corresponding to the raw data block, where a length d of the compressed data block is not greater than L2; and a standardization unit 92, configured to append additional data with a length of L2-d to the compressed data block to generate the standard compressed data block with the length of L2, where d is an integer greater than 0.

Alternatively, the compression unit 91 is configured to independently compress each of S consecutive raw data blocks in the raw data based on the compression algorithm to obtain S compressed data blocks that one-to-one correspond to the S raw data blocks, where each of the S raw data blocks includes a plurality of pieces of consecutive data in the raw data, a length of the plurality of pieces of consecutive data is not greater than L1, a length d of each of the S compressed data blocks is not greater than L2, and S is a positive integer.

The standardization unit 92 is configured to append additional data with a length of L2-d to each of the S compressed data blocks, to generate S standard compressed data blocks that each have the length of L2, where the standard data block with the length of L2 is a data block that can be completely processed by a single decompression engine in the decompression apparatus within one processing cycle, L1 and L2 are integers greater than 1, d is an integer greater than 0, and L1 is greater than L2.

For specific implementation of the functional units included in the compression apparatus 90, refer to related descriptions in the foregoing data compression method. Details are not described herein again. The units in the compression apparatus 90 may implement the foregoing data compression method based on hardware or software. For example, when the data compression method is implemented based on the hardware, the units may be implemented based on a circuit such as an FPGA or an ASIC; or when the data compression method is implemented based on the software, a corresponding function may be performed by enabling a CPU to read code that is stored in a memory and that can be used to implement functions of the foregoing units.

FIG. 10 is a schematic structural diagram of another compression apparatus according to an embodiment of the present disclosure. The compression apparatus 100 may implement the foregoing data compression method. The compression apparatus 100 includes a processor 101 and a memory 102. The processor 101 is connected to the memory 102 through a bus 103.

The memory 102 may be a read-only memory (ROM), a random access memory (RAM), or another memory. In this embodiment of this disclosure, the memory 102 is configured to store data such as raw data, and various software programs, for example, a data compression program in this disclosure. Optionally, the memory 102 may be a DDR memory, to improve a data transmission rate between the memory and the processor or between the memory and a decompression apparatus.

The processor 101 is a control center of a first computer device, and may be one processor, or may be an umbrella term of a plurality of processing elements. In specific implementation, in an optional embodiment, the processor 101 may include one or more CPUs. The processor 101 may further include a specific integrated circuit, for example, one or more microprocessors or one or more field programmable gate arrays (FPGA) that perform the data compression method in the embodiments of the present disclosure.

Optionally, the compression apparatus further includes a communications interface 104, and the communications interface 104 is configured to implement data exchange with another device such as the decompression apparatus.

The processor 101 is configured to invoke the data such as the raw data and program code that are stored in the memory 102, to compress a raw data block for one or more times, where the compressing a raw data block includes:

processing the raw data block based on a compression algorithm to obtain a standard compressed data block corresponding to the raw data block, where the raw data block is data included in the raw data.

In an implementation of this embodiment of this disclosure, for example, one raw data block is compressed. The processor 101 may independently compress the raw data block based on the compression algorithm to obtain a compressed data block corresponding to the raw data block, where a length d of the compressed data block is not greater than L2; and further append additional data with a length of L2-d to the compressed data block, to generate the standard compressed data block with a length of L2, where d is an integer greater than 0.

Alternatively, the processor 101 may independently compress each of S consecutive raw data blocks in the raw data based on the compression algorithm to obtain S compressed data blocks that one-to-one correspond to the S raw data blocks, where each of the S raw data blocks includes a plurality of pieces of consecutive data in the raw data, a length of the plurality of pieces of consecutive data is not greater than L1, and a length d of each of the S compressed data blocks is not greater than L2; and append additional data with a length of L2-d to each of the S compressed data blocks, to generate S standard compressed data blocks that each have a length of L2, where the standard data block with the length of L2 is a data block that can be completely processed by a single decompression engine in the decompression apparatus within one processing cycle, L1 and L2 are integers greater than 1, d is an integer greater than 0, and L1 is greater than L2.

Optionally, the raw data block may include a plurality of pieces of consecutive data in the raw data, a length of the raw data block is not greater than L1, and L1 is an egress bit width of the decompression engine.

In an implementation of this embodiment of this disclosure, a first raw data block is any one of the S raw data blocks.

When a length of the first raw data block is equal to L1, first additional data in a standard data block obtained by compressing the first raw data block is a valid codeword, or first additional data includes an invalid flag used to indicate, to the decompression engine, that the first additional data needs to be discarded, and invalid data that includes 0 or more bits and that is located behind the invalid flag.

When a length of the first raw data block is less than L1, first additional data includes an invalid flag used to indicate, to the decompression engine, that the first additional data in a standard data block obtained by compressing the first raw data block needs to be discarded, and invalid data that includes 0 or more bits and that is located behind the invalid flag.

In an implementation of this disclosure, that the processor 101 independently compresses the raw data block based on the compression algorithm to obtain a compressed data block corresponding to the raw data block, specifically includes the following some or all blocks:

S1: obtaining a to-be-compressed data group from the raw data, where the data group includes data including one or more bits;

S2: determining whether the to-be-compressed data group needs to be compressed; and if the to-be-compressed data group needs to be compressed, performing S3, or if the to-be-compressed data group does not need to be compressed, performing S4;

S3: compressing the to-be-compressed data block group, and performing S1 after the compression is completed; and S4: using data currently obtained through compression as the compressed data block.

The determining whether the to-be-compressed data group needs to be compressed includes: if a sum of a total length x of one or more data groups that have been compressed and a length Δx of the to-be-compressed data group is not greater than L1, and a length of a compressed data block generated after the to-be-compressed data group is compressed is not greater than L2, determining that compression needs to be performed; if a sum of x and Δx is not greater than L1, and a length of a compressed data block generated after the to-be-compressed data group is compressed is greater than L2, determining that no compression needs to be performed; or if a sum of x and Δx is greater than L1, determining that no compression needs to be performed.

In another implementation of this disclosure, that the processor 101 independently compresses the raw data block based on the compression algorithm to obtain a compressed data block corresponding to the raw data block, specifically includes the following some or all blocks:

compressing a data block with a length of L1 in the raw data by using a data group as a step, to obtain a temporary compressed data block; and when a length of the temporary compressed data block is greater than L2, using, as the raw data block, a data block obtained after i data groups at the tail of the data block with the length of L1 are removed, and using, as the compressed data block, data obtained by compressing the raw data block, where the length of the compressed data block is not greater than L2, and i may be a minimum positive integer that makes the compressed data block not greater than L2; or when a length of the temporary compressed data block is not greater than L2, using the data block with the length of L1 as the raw data block, and using the temporary compressed data block as the compressed data block.

In an implementation of this disclosure, L1 is an egress bit width of a single decompression engine; and/or L2 is an ingress bit width of a single decompression engine.

It should be understood that, for an implementation of functions of the components in the compression apparatus in this embodiment of this disclosure, refer to related descriptions in the foregoing data compression method embodiment. Details are not described again in this embodiment of this disclosure.

This disclosure further provides a first electronic device including a data compression function. The first electronic device may include any one compression apparatus described in FIG. 9 or FIG. 10.

The following describes in detail a data decompression method in an embodiment of the present disclosure with reference to the architecture of the electronic device shown in FIG. 2, the decompression apparatus shown in FIG. 3, and the schematic flowchart of the data decompression method shown in FIG. 11.

The data decompression method is performed by a second electronic device having a data decompression function or is performed by the decompression apparatus shown in FIG. 3. The second electronic device may be the electronic device shown in FIG. 2 or another electronic device including the decompression apparatus. The decompression apparatus may be the decompression apparatus shown in FIG. 3, or may be another decompression apparatus. This is not limited in this embodiment of this disclosure. In this embodiment of this disclosure, the data decompression method is described by using an example in which the second electronic device is the electronic device shown in FIG. 2 and the decompression apparatus is the decompression apparatus shown in FIG. 3.

A memory in the electronic device in which the decompression apparatus is located may store first data and a compressed data block obtained by compressing the first data. An operation apparatus may request, from the electronic device through a bus, to obtain second data whose start address is a random address add1 and that has a length of Q, where the first data includes the second data. The electronic device may determine, based on the requested address, P compressed data blocks including the second data, and further send the P compressed data blocks to the decompression apparatus. The decompression apparatus decompresses the P compressed data blocks, obtains raw data through splicing, and inputs the raw data into the operation apparatus, where the raw data includes the second data. The operation apparatus may obtain the second data from the raw data based on the requested address.

It should be noted that the electronic device may alternatively determine, based on an address of second data required by the electronic device, P compressed data blocks including the second data, and read, to the decompression apparatus through a bus, the P compressed data blocks stored in the memory. This is not limited in this embodiment of this disclosure.

In this embodiment of this disclosure, it is assumed that the decompression apparatus includes M decompression engines. Each of the M decompression engines is a decompression engine corresponding to a compression algorithm in the foregoing data decompression method embodiment, and is configured to decompress compressed data that is generated based on the compression algorithm. A single decompression engine is capable of decompressing one standard compressed data block within one clock cycle. In other words, the decompression apparatus decompresses a maximum of M standard compressed data blocks within one clock cycle.

In this embodiment of this disclosure, it is assumed that P=N and N≤M, that is, the second data required by the operation apparatus may be obtained through decompression within one clock cycle. It may be understood that P may alternatively be greater than M. In this case, the second data needs to be obtained through decompression within a plurality of clock cycles. A specific decompression method is similar to that for decompressing N compressed data blocks. Details are not described again in this embodiment of this disclosure.

Referring to a schematic flowchart of a data decompression method shown in FIG. 11, the data decompression method is performed by a second electronic device or a decompression apparatus. This embodiment of this disclosure provides description by using an example in which the data decompression method is performed by the decompression apparatus. The method includes all or some of the following blocks:

Block S111: The decompression apparatus obtains N standard compressed data blocks, where any one of the N standard compressed data blocks is a data block that has a length of L2 and that is generated after a raw data block is independently compressed, one standard compressed data block can be completely decompressed by a single decompression engine within one processing cycle, N is a positive integer, and M≥N.

The decompression apparatus obtains the N standard compressed data blocks through a bus, and a length of each of raw data blocks obtained by decompressing the N standard compressed data blocks may be not greater than L1. For a process of obtaining a standard compressed data block through compression, refer to related descriptions in the data compression methods in FIG. 4, FIG. 7, and FIG. 8. Details are not described again in this embodiment of this disclosure. L1 and L2 are integers greater than 1, and L1 is greater than L2.

Optionally, the decompression apparatus may include a distribution circuit, configured to distribute the N standard compressed data blocks to N decompression engines.

In this case, a specific implementation of the block S111 may be: receiving, by the decompression apparatus, the N standard compressed data blocks that are sent by a processor through the bus; and sequentially distributing the N standard compressed data blocks to the N decompression engines by using the distribution circuit.

Block S112: Decompress the N standard compressed data blocks respectively by using the N decompression engines, to obtain N raw data blocks, where the standard compressed data blocks one-to-one correspond to the raw data blocks, and a length of any one of the N raw data blocks may be not greater than L1.

In an implementation of this embodiment of this disclosure, a first decompression engine is any one of the N decompression engines, and a first standard compressed data block is any one of the N standard compressed data blocks. A decompression process performed by any one decompression engine is described by using an example in which the first decompression engine decompresses the first standard compressed data block. Specifically, the decompression apparatus may decompress the first standard compressed data block by using the first decompression engine; and when a length of a raw data block obtained by the first decompression engine through decompression is equal to L1, stop the decompression operation performed by the first decompression engine on the first compressed data block, and output the raw data block; or when the first decompression engine identifies an invalid flag, stop the decompression operation performed by the first decompression engine on the first compressed data block, and output a raw data block currently obtained through decompression.

In an implementation of this embodiment of this disclosure, the N decompression engines include a decompression engine i, the N standard compressed data blocks include a standard compressed data block i, the N raw data blocks include a raw data block i obtained by decompressing the standard compressed data block i, i is a positive integer, and i is not greater than N. The first decompression engine is configured to decompress the received standard compressed data block i, and obtain and output the raw data block i.

An implementation in which the decompression engine i performs decompression may be:

decompressing, by the decompression engine i, the standard compressed data block i.

The decompression engine i may include a counter that records a length of the raw data block i obtained by the decompression engine i through decompression. A comparator compares the length of the raw data block i with L1. When the length of the raw data block i obtained by the first decompression engine through decompression is equal to L1, the first decompression engine stops the decompression operation performed on the standard compressed data block i, and outputs the raw data block i.

When the first decompression engine identifies an invalid flag, the first decompression engine stops the decompression operation performed on the standard compressed data block i, and outputs the raw data block i obtained through decompression.

Another implementation in which the decompression engine i performs decompression may be:

completely decompressing, by the decompression engine i, the standard compressed data block i to obtain a raw data block; and when a length of the raw data block is greater than L1, discarding data located behind data with a length of L1 in the raw data block, to obtain the raw data block i with a length of L1.

When the decompression engine i identifies an invalid flag, the decompression engine i stops the decompression operation performed on the standard compressed data block i, and outputs the raw data block i obtained through decompression.

Optionally, the decompression apparatus may include a control circuit. When the length of the raw data block i obtained by the decompression engine i by decompressing the standard compressed data block i is equal to L1, the decompression apparatus may stop, by using the control circuit, the decompression operation performed by the decompression engine i on the standard compressed data block i.

Block S113: Splice the N raw data blocks to obtain raw data.

After the N decompression engines obtain the N raw data blocks through decompression, the decompression apparatus may splice the N raw data blocks to obtain the raw data.

Optionally, the decompression apparatus may also splice the N raw data blocks into the raw data by using a splicing circuit disposed inside the decompression apparatus.

After the block S113, the decompression apparatus may input the raw data into an operation apparatus.

In the embodiment shown in FIG. 11, the decompression apparatus obtains the N standard compressed data blocks, decompresses the N standard compressed data blocks respectively by using the N decompression engines, to obtain the N raw data blocks that one-to-one correspond to the N standard compressed data blocks, and splices the obtained N raw data blocks to obtain the raw data. Any one of the N standard compressed data blocks is a data block that has a length of L2 and that is generated by independently compressing a raw data block. In this way, various decompression engines can synchronously decompress a plurality of standard compressed data blocks. This improves data decompression efficiency.

Further, a granularity level at which the raw data can be divided is irrelevant to a quantity of decompression engines, and the raw data may be compressed into a large quantity of relatively small standard compressed data blocks. When data at a random address is accessed, a plurality of consecutive standard compressed data blocks in which the data at the random address is located are input into a plurality of decompression engines for decompression. This can implement multiple-speed decompression for compressed data at the random address.

Figure 12:
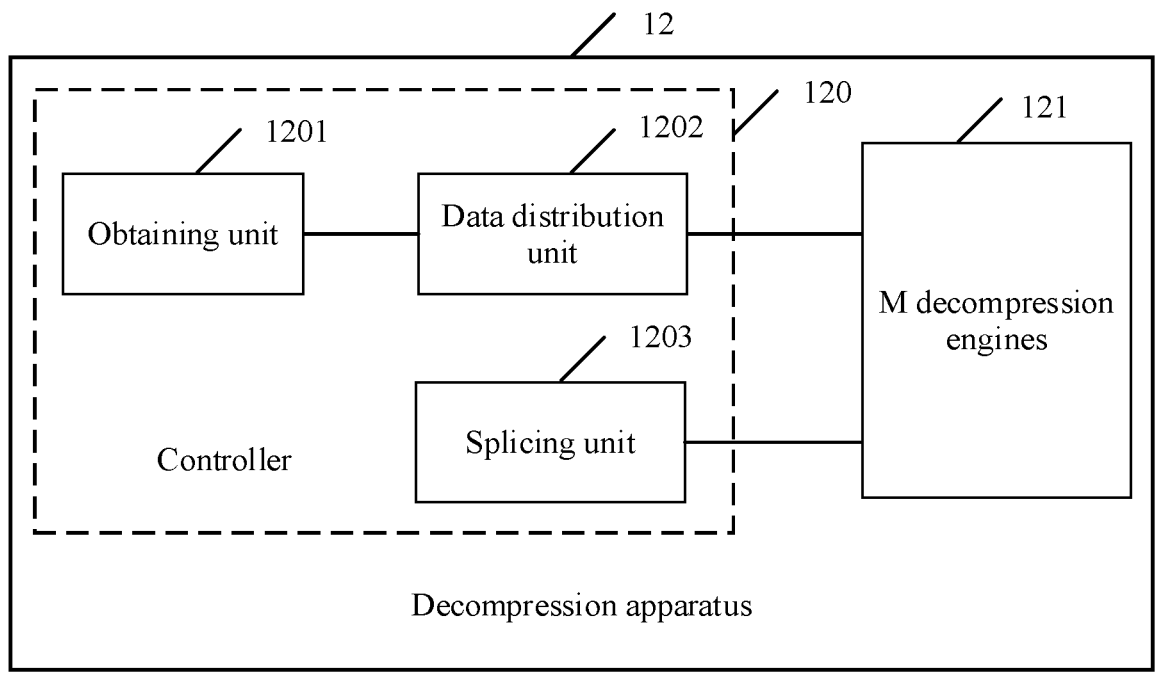
FIG. 12 is a schematic structural diagram of another decompression apparatus according to an embodiment of the present disclosure.

FIG. 12 is a schematic structural diagram of a decompression apparatus according to an embodiment of the present disclosure. The decompression apparatus 12 includes a controller 120 and M decompression engines 121. The controller includes an obtaining unit 1201, a data distribution unit 1202, and a splicing unit 1203.

The obtaining unit 1201 is configured to obtain N standard compressed data blocks, where any one of the N standard compressed data blocks is a data block that has a length of L2 and that is generated after a raw data block is independently compressed, one standard compressed data block can be completely decompressed by a single decompression engine within one processing cycle, N is a positive integer, and M≥N.

The data distribution unit 1202 decompresses in parallel the N standard compressed data blocks respectively by using N decompression engines, to obtain N raw data blocks, where the standard compressed data blocks one-to-one correspond to the raw data blocks.

The splicing unit 1203 is configured to splice the N raw data blocks to obtain raw data.

In an implementation of this embodiment of this disclosure, the data distribution unit 1202 may be specifically configured to distribute the N standard compressed data blocks to the N decompression engines in the M decompression engines, so that the N decompression engines respectively decompress the N standard compressed data blocks to obtain the N raw data blocks that one-to-one correspond to the N standard compressed data blocks, where a length of any one of the N raw data blocks is not greater than L1. It should be understood that, for specific implementation of the units in the decompression apparatus 12 in this embodiment of this disclosure, refer to related descriptions in the data decompression method shown in FIG. 11. Details are not described again in this embodiment of this disclosure.

The units in the controller 120 may implement the foregoing data compression method based on hardware or software. For example, when the data compression method is implemented based on the hardware, the units may be implemented based on a circuit such as an FPGA or an ASIC; or when the data compression method is implemented based on the software, a corresponding function may be performed by enabling a CPU to read code that is stored in a memory and that can be used to implement functions of the foregoing units. To achieve faster decompression, the hardware is used to implement functions of related units in this disclosure.

Figure 13:
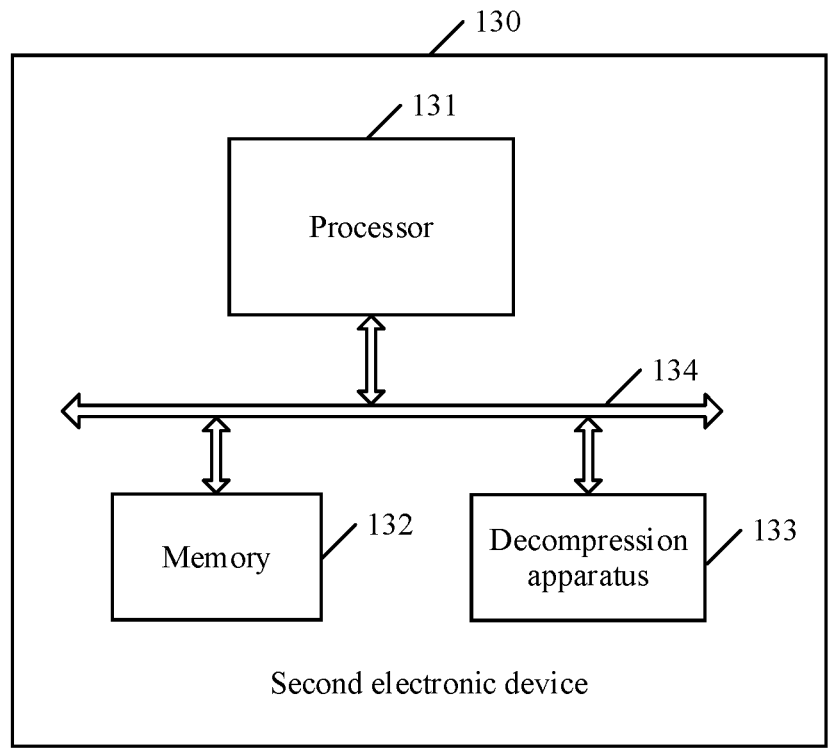
FIG. 13 is a schematic structural diagram of a second electronic device according to an embodiment of the present disclosure.

FIG. 13 is a schematic structural diagram of a second electronic device having a data decompression function according to an embodiment of the present disclosure. The second electronic device 13 includes a processor 131, a memory 132, and a decompression apparatus 133. The processor 131 is connected to the memory 132 and the decompression apparatus 133 through a bus 134.

The processor 131 is a control center of the decompression apparatus, and may be one or more CPUs, one or more microprocessors, one or more FPGAs, or the like. This is not limited in this embodiment of the present disclosure.

The memory 132 is configured to store data and an instruction, and may be a read-only memory, a random access memory, another memory, or the like. The processor 131 is configured to invoke the instruction in the memory 132 to implement a function of the second electronic device.

The decompression apparatus 133 is configured to decompress a received standard compressed data block to restore a raw data block. The decompression apparatus may be the decompression apparatus shown in FIG. 3 or FIG. 9. It should be understood that, for specific implementation of various functions of the decompression apparatus shown in FIG. 13, refer to related descriptions in the method embodiment shown in FIG. 11. Details are not described again in this embodiment of this disclosure.

An embodiment of this disclosure provides a compression and decompression system. The compression and decompression system may include a compression apparatus and a decompression apparatus. The compression apparatus may be any one compression apparatus shown in FIG. 9 or FIG. 10, and the decompression apparatus may be any one decompression apparatus shown in FIG. 3 or FIG. 12. It may be understood that the compression and decompression system may be disposed in a same electronic device, for example, in the electronic device shown in FIG. 2, or may be distributed in different electronic devices.

An embodiment of this disclosure further provides a compression and decompression system. The compression and decompression system may include a first electronic device and a second electronic device. For details, refer to related descriptions about the first electronic device and the second electronic device in the foregoing embodiments. Details are not described herein again.

It should be understood that the electronic device, the first electronic device, and the second electronic device in this disclosure may be devices such as a personal computer (PC), a mobile phone, a notebook computer, a tablet computer, a server, a gateway, and a router. The first electronic device and the second electronic device may be disposed in a same electronic device, for example, in the electronic device shown in FIG. 2, or may be disposed in different devices. This is not limited in this embodiment of this disclosure.

The following describes another data compression method provided in an embodiment of this disclosure. The data compression method is applied to a compression device or a third electronic device that can implement data compression. The following provides description by using an example in which the data compression method is applied to a compression apparatus.

The compression apparatus independently compresses each of S consecutive raw data blocks in raw data based on a compression algorithm to obtain S compressed data blocks that one-to-one correspond to the S raw data blocks, and records a length of each of the S compressed data blocks. Each of the S raw data blocks includes a plurality of pieces of consecutive data in the raw data, a length of the plurality of pieces of consecutive data is not greater than L1, a length d of each of the S compressed data blocks is not greater than L2, S is a positive integer, and a compressed data block with a length of L2 is a data block that can be completely processed by a single decompression engine within one processing cycle. A compressed data block obtained through compression is limited to be completely processed within one processing cycle. In this way, various decompression engines in a decompression apparatus may perform decompression synchronously.

FIG. 14 is a schematic flowchart of a data compression method according to an embodiment of this disclosure. The data compression method may include the following blocks.

S141: A compression apparatus independently compresses each of S consecutive raw data blocks in raw data based on a compression algorithm to obtain S compressed data blocks that one-to-one correspond to the S raw data blocks.

Each of the S raw data blocks includes a plurality of pieces of consecutive data in the raw data, a length of the plurality of pieces of consecutive data is not greater than L1, a length d of each of the S compressed data blocks is not greater than L2, S is a positive integer, a compressed data block with a length of L2 is a data block that can be completely processed by a single decompression engine in a decompression apparatus within one processing cycle, L1 and L2 are integers greater than 1, d is an integer greater than 0, and L1 is greater than L2.

S142: The compression apparatus records the length of each of the S compressed data blocks.

For descriptions about the "raw data", the "data block", the "raw data block", the "compressed data block", the "processing cycle", and the like, refer to related descriptions in the data compression method in FIG. 5 or in other embodiments. Details are not described again in this embodiment of this disclosure.

A difference between this data compression method and the data compression method shown in FIG. 5 is that, in the data compression method shown in FIG. 5, a standard compressed data block with a fixed length of L2 is finally obtained by appending additional data to a compressed data block. In this embodiment of this disclosure, a compressed data block is a finally obtained compressed data block, and a length of the compressed data block is not fixed. The compression apparatus needs to record the length of each compressed data block. In this way, the decompression apparatus can distinguish between compressed data blocks with different lengths in obtained compressed data.

For an implementation of the block S141, refer to the foregoing two implementations of S41. Details are not described again in this embodiment of this disclosure. In the two implementations of S41, the length of the compressed data block is close to L2 as much as possible. In this way, a decompression capability of each decompression engine in a fourth electronic device or the decompression apparatus is maximally used to decompress a first compressed data bock. This improves decompression efficiency.

A first raw data block is any one of the S raw data blocks, and the first compressed data block is a compressed data block that is in the S compressed data blocks and that corresponds to the first raw data block. The following uses the first compressed data block as an example to describe an implementation in which the compression apparatus records the length of the compressed data block. It may be understood that the compression apparatus may record a length of the first compressed data block in, but not limited to, the following two manners:

In a First Manner:

The compression apparatus records the length d of the first compressed data block into a start field of the first compressed data block, where the start field is a field that starts from a start location of the first compressed data block and that has a length of a third length threshold. The third length threshold may be 4 bits or 8 bits, and is related to a value of L2. For example, if L2 is 8 bytes, namely, a maximum length of the first compressed data block is 64 bits, a recorded length value does not exceed 64, and the third length threshold may be 8 bits.

After receiving the compressed data, the decompression apparatus obtains a first compressed data block by reading a length stored in a start field. A next first compressed data block is obtained by analogy, until all first compressed data blocks are obtained. Further, the decompression apparatus or the device sequentially inputs the plurality of first compressed data blocks into a decompression engine for decompression.

In a Second Manner:

The compression apparatus writes the length d of the first compressed data block into a first file, where the first file includes lengths of the S compressed data blocks that are sequentially obtained by the compression apparatus through compression.

The compression apparatus sequentially records the lengths of the S compressed data blocks into the first file in a data compression order. The compression apparatus sends the first file to the fourth electronic device or the decompression apparatus while transmitting the compressed data to the fourth electronic device or the decompression apparatus. The decompression apparatus or the device splits the received compressed data based on the plurality of lengths included in the first file, to obtain the S compressed data blocks. Further, the decompression apparatus or the device sequentially inputs the S compressed data blocks into a decompression engine for decompression.

The following describes a compression apparatus provided in an embodiment of this disclosure. As shown in FIG. 15, the compression apparatus 150 includes a compression unit 1501 and a recording unit 1502.

The compression unit 1501 is configured to independently compress each of S consecutive raw data blocks in raw data based on a compression algorithm to obtain S compressed data blocks that one-to-one correspond to the S raw data blocks, where each of the S raw data blocks includes a plurality of pieces of consecutive data in the raw data, a length of the plurality of pieces of consecutive data is not greater than L1, a length d of each of the S compressed data blocks is not greater than L2, S is a positive integer, a compressed data block with a length of L2 is a data block that can be completely processed by a single decompression engine within one processing cycle, L1 and L2 are integers greater than 1, d is an integer greater than 0, and L1 is greater than L2.

The recording unit 1502 is configured to record the length of each of the S compressed data blocks.

For specific implementation of the functional units included in the compression apparatus 150, refer to related descriptions in the data compression method shown in FIG. 13. Details are not described herein again. The units in the compression apparatus 150 may implement the foregoing data compression method based on hardware or software. For example, when the data compression method is implemented based on the hardware, the units may be implemented based on a circuit such as an FPGA or an ASIC; or when the data compression method is implemented based on the software, a corresponding function may be performed by enabling a CPU to read code that is stored in a memory and that can be used to implement functions of the foregoing units.

Figure 16:
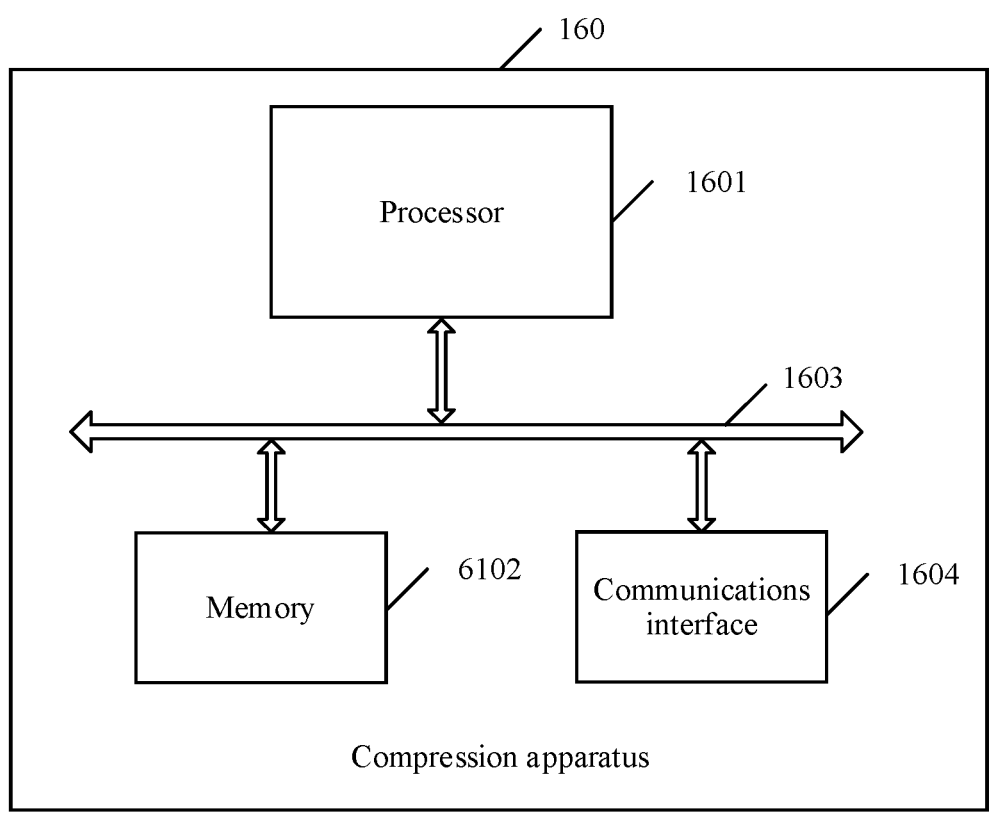
FIG. 16 is a schematic structural diagram of still another compression apparatus according to an embodiment of the present disclosure.

The following describes another compression apparatus provided in an embodiment of this disclosure. As shown in FIG. 16, the compression apparatus 160 includes a processor 1601 and a memory 1602. The processor 1601 is connected to the memory 1602 through a bus 1603. The memory 1602 is configured to store data and a program instruction.

The memory 1602 may be a read-only memory (ROM), a random access memory (RAM), or another memory. In this embodiment of this disclosure, the memory 1602 is configured to store data such as raw data, and various software programs, for example, a program for performing the data compression method shown in FIG. 14. Optionally, the memory 1602 may be a DDR memory, to improve a data transmission rate between the memory 1602 and the processor 1601 or between the memory 1601 and a decompression apparatus.

The processor 1601 is a control center of a first computer device, and may be one processor, or may be an umbrella term of a plurality of processing elements. In specific implementation, in an optional embodiment, the processor 1601 may include one or more CPUs. The processor 1601 may further include a specific integrated circuit, for example, one or more microprocessors or one or more field programmable gate arrays (FPGA) that perform the data compression method in the embodiments of the present disclosure.

Optionally, the compression apparatus further includes a communications interface 1604, and the communications interface 1604 is configured to implement data exchange with another device such as a second decompression device.

The processor 1601 invokes the data and a program instruction that are stored in the memory 1602, to perform the following method:

independently compressing each of S consecutive raw data blocks in raw data based on a compression algorithm to obtain S compressed data blocks that one-to-one correspond to the S raw data blocks, where each of the S raw data blocks includes a plurality of pieces of consecutive data in the raw data, a length of the plurality of pieces of consecutive data is not greater than L1, a length d of each of the S compressed data blocks is not greater than L2, S is a positive integer, a compressed data block with a length of L2 is a data block that can be completely processed by a single decompression engine within one processing cycle, L1 and L2 are integers greater than 1, d is an integer greater than 0, and L1 is greater than L2; and recording the length of each of the S compressed data blocks.

Optionally, the compression apparatus may further include the communications interface 1604, to implement data transmission between the compression apparatus and a communications peer such as the decompression apparatus.

For specific implementation of performing blocks by the compression apparatus 160, refer to related descriptions in the data compression method shown in FIG. 13. Details are not described herein again.

Figure 17:
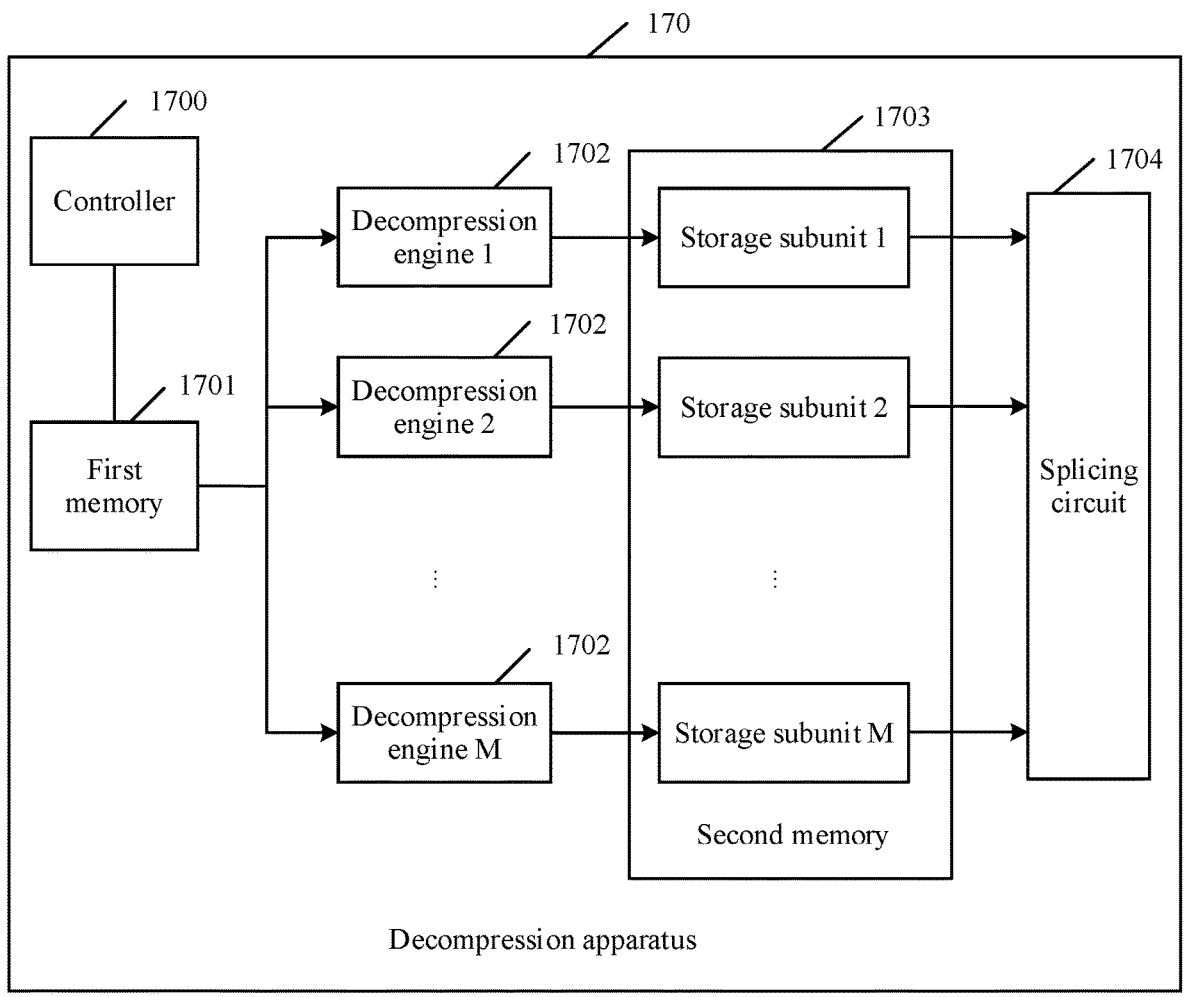
FIG. 17 is a schematic structural diagram of still another decompression apparatus according to an embodiment of the present disclosure.

The following describes another decompression apparatus in an embodiment of this disclosure. As shown in FIG. 17, the decompression apparatus 170 may include a controller 1700, a first memory 1701, M decompression engines 1702, and a second memory 1703.

The controller 1700 is configured to: obtain compressed data, where the compressed data includes N compressed data blocks and a length of each of the N compressed data blocks; and split the compressed data into the N compressed data blocks based on the length of each of the N compressed data blocks.

The first memory 1701 is configured to store the N compressed data blocks, where any one of the N compressed data blocks is a data block that is obtained through independent compression and that has a length not greater than L2, N is a positive integer, M≥N, a compressed data block with a length of L2 is a data block that can be completely processed by a single decompression engine within one processing cycle, L1 and L2 are integers greater than 1, and L1 is greater than L2.

Each of N decompression engines is configured to: obtain one of the N compressed data blocks, and decompress the obtained compressed data block, to obtain N raw data blocks that one-to-one correspond to the N compressed data blocks, where a length of any one of the N raw data blocks is not greater than L1, and the M decompression engines include the N decompression engines.

The second memory 1703 is configured to store the N raw data blocks.

In a possible implementation, the decompression apparatus 170 further includes a splicing circuit 1704. The splicing circuit 1704 is configured to splice the N raw data blocks to obtain raw data.

Optionally, the first memory 1701 may include M storage subunits that one-to-one correspond to the M decompression engines, and one storage subunit may store one compressed data block. Likewise, the second memory 1703 may include M storage subunits that one-to-one correspond to the M decompression engines, and one storage subunit may store one raw data block.

It should be noted that one storage subunit in the first memory and/or one storage subunit in the second memory may be disposed in a corresponding decompression engine. This is not limited in this embodiment of this disclosure.

It should be noted that the controller 1700 is not a mandatory component of the decompression apparatus 170. The decompression apparatus 170 may not include the controller 1700, and the controller 1700 is disposed in a fourth electronic device including the decompression apparatus 170. Various procedures in the controller 1700 may implement the foregoing data compression method based on hardware or software. For example, when the data compression method is implemented based on the hardware, the units may be implemented based on a circuit such as an FPGA or an ASIC; or when the data compression method is implemented based on the software, a corresponding function may be performed by enabling a CPU to read code that is stored in a memory and that can be used to implement the foregoing procedures.

An embodiment of this disclosure further provides a fourth electronic device capable of implementing a data decompression function. The fourth electronic device may include the decompression apparatus shown in FIG. 17.

The following describes a data decompression method provided in this disclosure and corresponding to the data compression method shown in FIG. 14. The method is applied to a fourth electronic device or a decompression apparatus. The fourth electronic device may be the electronic device shown in FIG. 2 or another electronic device including the decompression apparatus. The decompression apparatus may be the decompression apparatus shown in FIG. 17, or may be another decompression apparatus.

Figure 18:
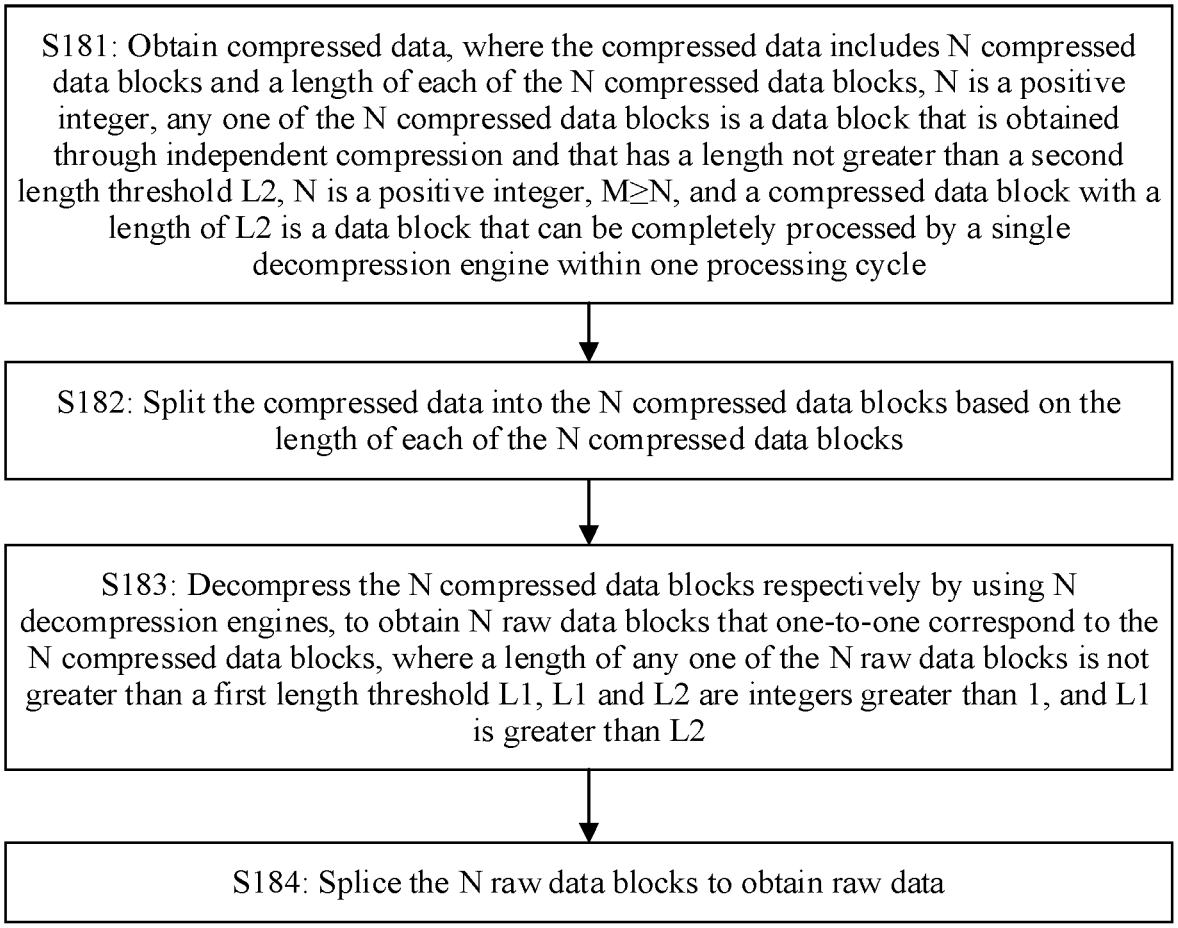
FIG. 18 is a schematic flowchart of another data decompression method according to an embodiment of the present disclosure.

FIG. 18 is a schematic flowchart of a decompression method. The method includes but is not limited to the following blocks:

S181: Obtain compressed data, where the compressed data includes N compressed data blocks and a length of each of the N compressed data blocks, N is a positive integer, any one of the N compressed data blocks is a data block that is obtained through independent compression and that has a length not greater than L2, N is a positive integer, M≥N, and a compressed data block with a length of L2 is a data block that can be completely processed by a single decompression engine within one processing cycle.

S182: Split the compressed data into the N compressed data blocks based on the length of each of the N compressed data blocks.

S183: Decompress the N compressed data blocks respectively by using N decompression engines, to obtain N raw data blocks that one-to-one correspond to the N compressed data blocks, where a length of any one of the N raw data blocks is not greater than L1, L1 and L2 are integers greater than 1, and L1 is greater than L2.

S184: Splice the N raw data blocks to obtain raw data.

The compressed data block is a compressed data block obtained by using the data compression method shown in FIG. 14. For details, refer to related descriptions in the data compression method shown in FIG. 14. Details are not described again in this embodiment of this disclosure.

In an embodiment of this disclosure, after receiving the compressed data, a decompression apparatus obtains a compressed data block by reading a length stored in a start field. A next compressed data block is obtained by analogy, until the N compressed data blocks are obtained. Further, the decompression apparatus sequentially inputs the N compressed data blocks into a decompression engine for decompression.

In an embodiment of this disclosure, a compression apparatus may sequentially record the length of each compressed data block into a first file in a data compression order. After the compression apparatus transmits the compressed data including the N compressed data blocks and the first file to the decompression apparatus, the decompression apparatus may split the received compressed data based on the plurality of lengths included in the first file, to obtain the N compressed data blocks. Further, the decompression apparatus sequentially inputs the N compressed data blocks into the N decompression engines for decompression.

Figure 19:
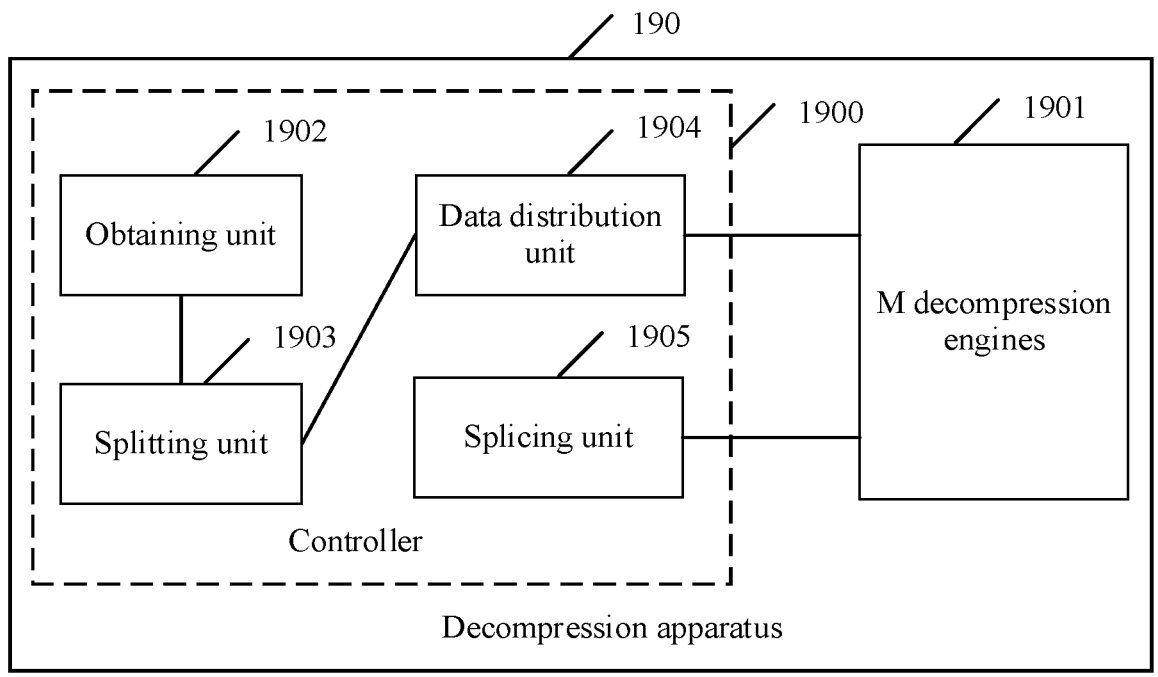
FIG. 19 is a schematic structural diagram of still another decompression apparatus according to an embodiment of the present disclosure.

FIG. 19 is a schematic structural diagram of still another decompression apparatus according to an embodiment of the present disclosure. The decompression apparatus 190 may include a controller 1900 and M decompression engines 1901. The controller 1900 includes the following units:

an obtaining unit 1902, configured to obtain compressed data, where the compressed data includes N compressed data blocks and a length of each of the N compressed data blocks, N is a positive integer, any one of the N compressed data blocks is a data block that is obtained through independent compression and that has a length not greater than L2, N is a positive integer, M≥N, and a compressed data block with a length of L2 is a data block that can be completely processed by a single decompression engine within one processing cycle;

a splitting unit 1903, configured to split the compressed data into the N compressed data blocks based on the length of each of the N compressed data blocks;

a data distribution unit 1904, configured to distribute the N compressed data blocks to N decompression engines, so that the N decompression engines respectively decompress the N compressed data blocks to obtain N raw data blocks that one-to-one correspond to the N compressed data blocks, where a length of each of the N raw data blocks is not greater than L1, L1 and L2 are integers greater than 1, and L1 is greater than L2; and a splicing unit 1905, configured to splice the N raw data blocks to obtain raw data.

For specific implementation of the functional units included in the decompression apparatus 190, refer to related descriptions in the data decompression method shown in FIG. 18. Details are not described herein again. The units in the controller 1900 may implement the foregoing data compression method based on hardware or software. For example, when the data compression method is implemented based on the hardware, the units may be implemented based on a circuit such as an FPGA or an ASIC; or when the data compression method is implemented based on the software, a corresponding function may be performed by enabling a CPU to read code that is stored in a memory and that can be used to implement functions of the foregoing units. To achieve faster decompression, the hardware is used to implement functions of related units in this disclosure.

An embodiment of this disclosure further provides a fourth electronic device capable of implementing a data decompression function. The fourth electronic device may include any one decompression apparatus shown in FIG. 17 or FIG. 19. For example, the fourth electronic device 200 includes a processor 2001, a memory 2002, and a decompression apparatus 2003. The processor 2001 is connected to the memory 2002 and the decompression apparatus 2003 through a bus 2004.

The processor 2001 is a control center of the decompression apparatus, and may be one or more CPUs, one or more microprocessors, one or more FPGAs, or the like. This is not limited in this embodiment of the present disclosure.

The memory 2002 is configured to store data and an instruction, and may be a read-only memory, a random access memory, another memory, or the like. The processor 2001 is configured to invoke the instruction in the memory 2002 to implement a function of the fourth electronic device.

Figure 20:
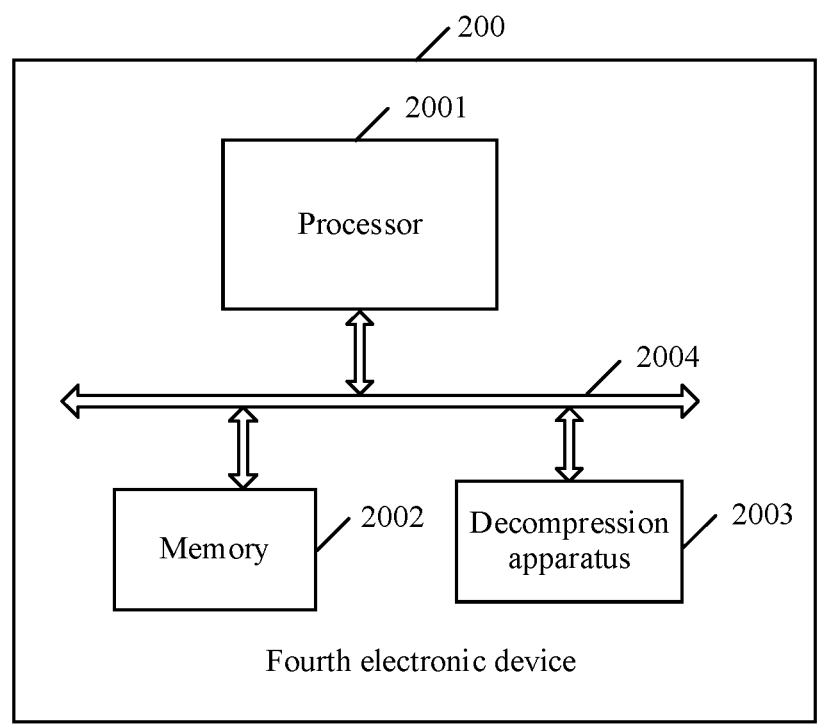
FIG. 20 is a schematic structural diagram of a fourth electronic device according to an embodiment of the present disclosure.

The decompression apparatus 2003 is configured to decompress a received compressed data block to restore a raw data block. The decompression apparatus may be the decompression apparatus shown in FIG. 17 or FIG. 19. It should be understood that, for specific implementation of various functions of the decompression apparatus shown in FIG. 20, refer to related descriptions in the method embodiment shown in FIG. 18. Details are not described again in this embodiment of this disclosure.

Optionally, the fourth electronic device may further include an operation apparatus. The operation apparatus is coupled to the decompression apparatus and the processor, and is configured to perform data processing based on raw data obtained by the decompression apparatus through decompression. For details, refer to related descriptions about a computation apparatus in the electronic device shown in FIG. 2. Details are not described herein again.

An embodiment of this disclosure further provides a compression and decompression system. The compression and decompression system may include a compression apparatus and a decompression apparatus, where the compression apparatus may be any one compression apparatus shown in FIG. 15 or FIG. 16, and the decompression apparatus may be any one decompression apparatus shown in FIG. 17 or FIG. 19. It may be understood that the compression and decompression system may be disposed in a same electronic device, or may be distributed in different electronic devices.

An embodiment of this disclosure further provides a compression and decompression system. The compression and decompression system may include a third electronic device and a fourth electronic device. For details, refer to related descriptions about the third electronic device and the fourth electronic device in the foregoing embodiments. Details are not described herein again.

It should be understood that the third electronic device and the fourth electronic device in this disclosure may be devices such as a personal computer (PC), a mobile phone, a notebook computer, a tablet computer, a server, a gateway, and a router. The third electronic device and the fourth electronic device may be disposed in a same electronic device, or may be disposed in different devices. This is not limited in this embodiment of this disclosure.

A person of ordinary skill in the art may understand that all or some of the processes of the methods in the embodiments may be implemented by a computer program instructing relevant hardware. The program may be stored in a computer-readable storage medium. When the program runs, the processes of the methods in the embodiments are performed. The foregoing storage medium includes: any medium that can store program code, such as a ROM, a random access memory RAM, a magnetic disk, or an optical disc.

What is claimed is:

1. A method for compressing raw data into one or more standard compressed data blocks that each have a length of L2 and that are to be decompressed in parallel by a decompression apparatus the method comprising:
compressing a raw data block for one or more times, wherein the decompression apparatus comprises a plurality of decompression engines, each decompression engine is capable of decompressing one standard compressed data block within one processing cycle, L2 is an integer greater than 1, and wherein the compressing a raw data block comprises:
processing the raw data block based on a compression algorithm to obtain the standard compressed data block corresponding to the raw data block, wherein the raw data block is part of the raw data.

2. The method of claim 1, wherein processing the raw data block based on a compression algorithm to obtain the standard compressed data block corresponding to the raw data block comprises:
independently compressing the raw data block based on the compression algorithm to obtain a compressed data block corresponding to the raw data block, wherein a length d of the compressed data block is not greater than L2; and
appending additional data with a length of L2—d to the compressed data block to generate the standard compressed data block with the length of L2, wherein d is an integer greater than 0.

3. The method of claim 2, wherein the raw data block comprises a plurality of pieces of consecutive data in the raw data, a length of the raw data block is not greater than L1, and L1 is an egress bit width of the decompression engine.

4. The method of claim 3, wherein
when the length of the raw data block is equal to L1, the additional data in the standard compressed data block corresponding to the raw data block is a valid codeword; or the additional data comprises an invalid flag and invalid data, wherein the invalid flag is used to indicate that the additional data needs to be discarded; or
when the length of the raw data block is less than L1, the additional data comprises the invalid flag and the invalid data, wherein the invalid flag is used to indicate that the additional data needs to be discarded.

5. The method of claim 3, wherein independently compressing the raw data block based on the compression algorithm to obtain a compressed data block corresponding to the raw data block comprises:
S1: obtaining a to-be-compressed data group from the raw data, wherein the data group comprises data comprising one or more bits;
S2: determining whether the to-be-compressed data group needs to be compressed; and if the to-be-compressed data group needs to be compressed, performing S3, or if the to-be-compressed data group does not need to be compressed, performing S4;
S3: compressing the to-be-compressed data group, and performing S1 after the compression is completed; and
S4: using data currently obtained through compression as the compressed data block; wherein
determining whether the to-be-compressed data group needs to be compressed comprises: if a sum of a total length x of one or more data groups that have been compressed and a length Δx of the to-be-compressed data group is not greater than L1, and a length of a compressed data block generated after the to-be-compressed data group is compressed is not greater than L2, determining that compression needs to be performed; if a sum of x and Δx is not greater than L1, and a length of a compressed data block generated after the to-be-compressed data group is compressed is greater than L2, determining that no compression needs to be performed; or if a sum of x and Δx is greater than L1, determining that no compression needs to be performed.

6. The method of claim 3, wherein independently compressing the raw data block based on the compression algorithm to obtain a compressed data block corresponding to the raw data block comprises:
compressing a data block with a length of L1 in the raw data by using a data group as a step, to obtain a temporary compressed data block; and
when a length of the temporary compressed data block is greater than L2, using, as the raw data block, a data block obtained after i data groups at a tail of the data block with the length of L1 are removed, and using, as the compressed data block, data obtained by compressing the raw data block, wherein the length of the compressed data block is not greater than L2, and i is a minimum positive integer that makes the length of the compressed data block not greater than L2; or
when a length of the temporary compressed data block is not greater than L2, using the data block with the length of L1 as the raw data block, and using the temporary compressed data block as the compressed data block.

7. The method of claim 1, wherein L2 is an ingress bit width of a single decompression engine.

8. A compression apparatus, configured to compress raw data into one or more standard compressed data blocks that each have a length of L2 and that are to be decompressed in parallel by a decompression apparatus, wherein the decompression apparatus comprises a plurality of decompression engines, each decompression engine is capable of decompressing one standard compressed data block within one processing cycle, L2 is an integer greater than 1, the compression apparatus comprising:
a processor and a memory, the memory is configured to store data and a program instruction, the processor invokes the data and the program instruction that are stored in the memory, to compress a raw data block for one or more times, wherein compressing the raw data block comprises:
processing the raw data block based on a compression algorithm to obtain the standard compressed data block corresponding to the raw data block, wherein the raw data block is part of the raw data.

9. The compression apparatus of claim 8, wherein processing, by the processor, the raw data block based on a compression algorithm to obtain the standard compressed data block corresponding to the raw data block, specifically comprises:
independently compressing the raw data block based on the compression algorithm to obtain a compressed data block corresponding to the raw data block, wherein a length d of the compressed data block is not greater than L2; and
appending additional data with a length of L2—d to the compressed data block to generate the standard compressed data block with the length of L2, wherein d is an integer greater than 0.

10. The compression apparatus of claim 9, wherein the raw data block comprises a plurality of pieces of consecutive data in the raw data, a length of the raw data block is not greater than L1, and L1 is an egress bit width of the decompression engine.

11. The compression apparatus of claim 10, wherein
when the length of the raw data block is equal to L1, the additional data in the standard compressed data block corresponding to the raw data block is a valid codeword; or the additional data comprises an invalid flag and invalid data, wherein the invalid flag is used to indicate that the additional data needs to be discarded; or
when the length of the raw data block is less than L1, the additional data comprises an invalid flag and invalid data, wherein the invalid flag is used to indicate that the additional data needs to be discarded.

12. The compression apparatus of claim 10, wherein independently compressing, by the processor, the raw data block based on the compression algorithm to obtain a compressed data block corresponding to the raw data block, comprises the following operations:
S1: obtaining a to-be-compressed data group from the raw data, wherein the to-be-compressed data group comprises data comprising one or more bits;
S2: determining whether the to-be-compressed data group needs to be compressed; and if the to-be-compressed data group needs to be compressed, performing S3, or if the to-be-compressed data group does not need to be compressed, performing S4;
S3: compressing the to-be-compressed data group, and performing S1 after the compression is completed; and
S4: using data currently obtained through compression as the compressed data block; wherein
the determining whether the to-be-compressed data group needs to be compressed comprises: if a sum of a total length x of one or more data groups that have been compressed and a length $\Delta x$ of the to-be-compressed data group is not greater than L1, and a length of a compressed data block generated after the to-be-compressed data group is compressed is not greater than L2, determining that compression needs to be performed; if a sum of x and $\Delta x$ is not greater than L1, and a length of a compressed data block generated after the to-be-compressed data group is compressed is greater than L2, determining that no compression needs to be performed; or if a sum of x and $\Delta x$ is greater than L1, determining that no compression needs to be performed.

13. The compression apparatus of claim 12, wherein independently compressing, by the processor, the raw data block based on the compression algorithm to obtain the compressed data block corresponding to the raw data block, specifically comprises:
compressing a data block with a length of L1 in the raw data by using a data group as a step, to obtain a temporary compressed data block; and
when a length of the temporary compressed data block is greater than L2, using, as the raw data block, a data block obtained after i data groups at a tail of the data block with the length of L1 are removed, and using, as the compressed data block, data obtained by compressing the raw data block, wherein the length of the compressed data block is not greater than L2, and i is a minimum positive integer that makes the compressed data block not greater than L2; or
when a length of the temporary compressed data block is not greater than L2, using the data block with the length of L1 as the raw data block, and using the temporary compressed data block as the compressed data block.

14. The compression apparatus of claim 8, wherein L2 is an ingress bit width of a single decompression engine.

15. A decompression apparatus, comprising:
a first memory, M decompression engines, and a second memory, wherein:
the first memory is configured to store a plurality of standard compressed data blocks, wherein one standard compressed data block is a data block that has a length of L2 and is generated after a raw data block is independently compressed, and one standard compressed data block can be completely decompressed by a single decompression engine within one processing cycle, and M is an integer greater than 1;
the M decompression engines are configured to decompress in parallel the standard compressed data blocks stored in the first memory, and one decompression engine is configured to decompress one standard compressed data block; and
the second memory is configured to store raw data blocks obtained by decompressing the standard compressed data blocks, wherein the standard compressed data blocks one-to-one correspond to the raw data blocks.

16. The decompression apparatus of claim 15, wherein the decompression apparatus further comprises a splicing circuit; and
the splicing circuit is configured to splice the raw data blocks stored in the second memory, to obtain raw data.

17. The decompression apparatus of claim 15, wherein each of the M decompression engines is further configured to:
when a length of the raw data block obtained through decompression is equal to L1 or when an invalid flag in the standard compressed data block is identified, stop the decompression operation.

18. The decompression apparatus of claim 15, wherein the decompression apparatus further comprises a control circuit, configured to:
when a length of the raw data block obtained by a first decompression engine through decompression is equal to L1, stop the decompression operation performed by the first decompression engine, wherein the first decompression engine is any one of the N decompression engines.

19. The decompression apparatus of claim 17, wherein an egress bit width of the decompression engine is L1, and the length of the raw data block is not greater than L1.

20. The decompression apparatus of claim 15, wherein the second memory comprises M storage subunits that one-to-one correspond to the M decompression engines, a first storage subunit is configured to store the raw data block obtained, through decompression, by a decompression engine corresponding to the first storage subunit, and the first storage subunit is any one of the M storage subunits.

* * * * *

UNITED STATES PATENT AND TRADEMARK OFFICE
CERTIFICATE OF CORRECTION

PATENT NO. : 11,463,102 B2
APPLICATION NO. : 17/162153
DATED : October 4, 2022
INVENTOR(S) : Chao Lu, Baoqing Liu and Leijun He It is certified that error appears in the above-identified patent and that said Letters Patent is hereby corrected as shown below:

In the Claims

In Claim 5, Column 46, Line 6, delete "Ax" and insert -- $\Delta x$ --.

In Claim 12, Column 47, Line 43, delete "Ax" and insert -- $\Delta x$ --.

In Claim 12, Column 47, Line 47, delete "Ax" and insert -- $\Delta x$ --.

Signed and Sealed this
Tenth Day of January, 2023

Katherine Kelly Vidal
*Director of the United States Patent and Trademark Office*